US006262695B1

(12) United States Patent
McGowan

(10) Patent No.: US 6,262,695 B1
(45) Date of Patent: Jul. 17, 2001

(54) METHOD AND APPARATUS FOR PHASE-LOCKING A PLURALITY OF DISPLAY DEVICES AND MULTI-LEVEL DRIVER FOR USE THEREWITH

(75) Inventor: Scott J. McGowan, Kirkland, WA (US)

(73) Assignee: Tridium Research, Inc., Seattle, WA (US)

( * ) Notice: Subject to any disclaimer, the term of this patent is extended or adjusted under 35 U.S.C. 154(b) by 0 days.

(21) Appl. No.: 09/192,884

(22) Filed: Nov. 16, 1998

Related U.S. Application Data

(60) Provisional application No. 60/065,686, filed on Nov. 18, 1997.

(51) Int. Cl.[7] ........................................ H03L 7/08

(52) U.S. Cl. .............................. 345/1; 345/30; 345/99; 345/204; 345/212; 345/213; 348/500; 348/505; 348/510; 348/512; 348/518

(58) Field of Search .............................. 345/1, 30, 99, 345/204, 212, 213; 348/505, 510, 512, 518, 500

(56) References Cited

U.S. PATENT DOCUMENTS

| | | | | |
|---|---|---|---|---|
| 4,305,045 | * | 12/1981 | Metz et al. | 331/1 A |
| 4,439,788 | * | 3/1984 | Frame | 348/262 |
| 4,562,402 | * | 12/1985 | Irvin | 327/156 |
| 4,860,285 | * | 8/1989 | Miller et al. | 370/507 |
| 5,553,222 | * | 9/1996 | Milne et al. | 395/806 |
| 5,815,689 | * | 9/1998 | Shaw et al. | 713/400 |

* cited by examiner

*Primary Examiner*—Bipin Shalwala
*Assistant Examiner*—Vincent E. Kovalick
(74) *Attorney, Agent, or Firm*—Robert M. Storwick

(57) ABSTRACT

A method and apparatus for phase-locking a plurality of display devices and multi-level driver for use therewith. Each of the display devices displays an image under the control of a distinct clock having a distinct clock rate. Each of the images contains a predetermined periodic indexing event. One of the clocks is designated as a master clock. The times of occurrence of the indexing events are compared, and the times of occurrence are caused to fall within a predetermined amount of time of one another so that each of the other clocks is phase-locked with the master clock.

2 Claims, 13 Drawing Sheets

MULTIPLE MPEG DECODERS FUNCTIONING WITH VERTICAL AND/OR HORZONTAL PHASE LOCKING BY WAY OF A CLOCK PULSE SUBTRACTING CIRCUIT TO ACHIEVE PHASE LOCKING UNDER A CONTROL PROGRAM

METHOD AND APPARATUS FOR PHASE-LOCKING A PLURALITY OF DISPLAY DEVICES AND MULTI-LEVEL DRIVER FOR USE THEREWITH

REFERENCE TO PROVISIONAL APPLICATION

This application claims the benefit of the U.S. Provisional Application No. 60/065,686, filed Nov. 18, 1997.

TECHNICAL FIELD

The present invention relates to methods and apparatus for displaying information, and more particularly, to methods and apparatus for causing two or more display devices to display information. The present invention also relates to video display drivers, and more particularly, to multi-level video display drivers and methods for their use with and in apparatus for displaying information.

BACKGROUND OF THE INVENTION

Video circuit designs for providing synchronized video signals are useful with personal computers (PCs). Such designs place one image over another image on a PC display system and phase-lock multiple rasters (such as might be used in multiple display systems). The images can then be moved independently with movement commands to the video circuits. Further, a foreground image, such as an animation character surrounded by other background imagery, can be generated by giving portions of image around the animation character on the foreground image a transparency attribute, allowing the background imagery to be seen through the portions of the foreground image that have the transparency attribute. In the prior art, video circuit designs for providing synchronized video signals for the use of personal computers (PCs) in such applications are too large and expensive to be widely marketable to the public.

In the past, the method of painting top images on clear mylar or cellulose has been used and is widely accepted by animation artists. This is the same method that video game electronics companies use to electronically show small images known as sprites over large images. However, this has never been done with common video graphics adapter (VGA) PC-compatible computers. This overlaying of images is also known as color-keying, as a key color indicates transparency to the circuits. Color keying has been done before, but never on two or more raster images that had achieved the required synchronization and phase lock with a low cost circuit of the inventive type. Achieving synchronization of video raster scan circuits is easy and can even be done accidentally, if the same pixel clock is used for two or more taster scan circuits. However, phase lock is a concept that typically requires considerably circuitry.

The vast majority of video raster circuits that are available now cannot be synchronized. This is because the manufacturers of these circuits do not wish to add the expense of having all the horizontal pixel counters and vertical line counters with the feature of a zero reset. A zero reset feature is necessary to synchronize video raster circuits.

It is also desirable to have software that can operate effectively with multiple-monitor display systems. As operating systems and other portions of software on a PC change, the drivers necessary to correctly drive the display systems also change. It is, therefore, advantageous to have the driver software organized so that it can easily be changed in accord with the changes to the software that is involved in producing the information and images that are to be displayed.

SUMMARY OF THE INVENTION

According to one aspect, the invention is a method for phase-locking a plurality of display devices. Each of the display devices displays an image under the control of a distinct clock having a distinct clock rate. Each of the images contains a predetermined periodic indexing event. The method includes the steps of a) designating one of the distinct clocks to be a master clock and the remaining clocks to be slave clocks and b) synchronizing the distinct clocks. Step b) includes the steps of: b1) first causing the greatest difference between the clock rates of all of the distinct clocks to be within a predetermined difference rate of one another, and b2) then causing the predetermined difference rate to be reduced to zero.

The method also includes the steps of c) comparing the times of occurrence of the indexing event for the image displayed under the control of the master clock to the times of occurrence of the indexing events for the images displayed under the control of the slave clocks, d) if any one of said times of occurrence under the control of one of the slave clocks differs from the time of occurrence under the control of the master clock by more than a predetermined amount of time, causing said time of occurrence of said slave clock to occur within the predetermined amount of time of the time of occurrence of the master clock; and e) repeating steps c) and d) until the slave clocks are phase-locked.

In accordance with another aspect, the invention is an apparatus for phase-locking a plurality of display devices. Each of the display devices displays an image under the control of a distinct clock having a distinct clock rate. Each of the images contains a predetermined periodic indexing event. The apparatus includes a designation circuit to receive each of the distinct clocks and to designate one of the distinct clocks to be a master clock and the remaining clocks to be slave clocks, and a synchronization circuit to synchronize the distinct clocks. The synchronization circuit includes a clock rate comparison circuit to compare the clock rates of all of the distinct clocks and to determine the greatest difference between the rates of all of the distinct clocks, a control circuit to receive said greatest difference and to cause said greatest difference to be within a predetermined difference rate of one another, and a rate difference circuit to cause said predetermined difference rate to be reduced to zero.

The apparatus further includes a times-of-occurrence comparison circuit to receive the times of occurrence of the indexing events for the images displayed under the control of the master clock and the slave clocks, to compare the times of occurrence of the indexing event for the image displayed under the control of the master clock to the times of occurrence of the indexing events for the images displayed under the control of the slave clocks, and to produce signals indicative of the differences between the time of occurrence of the indexing event for the image displayed under the control of the master clock and the times of occurrence of the indexing events for the images displayed under the control of the slave clocks.

In addition the apparatus includes a reset circuit to receive the signals indicative of said differences, to compare the signals indicative of said differences, and, if any one of said differences exceeds a predetermined amount of time, to cause said corresponding time of occurrence of said slave clock to occur within the predetermined amount of time of the time of occurrence of the master clock; and a repetition circuit to iteratively cause the times-of-occurrence comparison circuit and the reset circuit to operate until the slave clocks are phase-locked.

In accordance with a still further aspect, the invention is an apparatus for phase-locking a plurality of display devices. Each of the display devices displays an image under the control of a distinct clock having a distinct clock rate. Each of the images containing a predetermined periodic indexing event. The apparatus includes means for designating one of the distinct clocks to be a master clock and the remaining clocks to be slave clocks and means for synchronizing the distinct clocks. The means for synchronizing the distinct clocks includes means for first causing the greatest difference between the clock rates of all of the distinct clocks to be within a predetermined difference rate of one another, and means for then causing the predetermined difference rate to be reduced to zero.

The apparatus further includes comparison means for comparing the times of occurrence of the indexing event for the image displayed under the control of the master clock to the times of occurrence of the indexing events for the images displayed under the control of the slave clocks, time control means for causing said time of occurrence of said slave clock to occur within the predetermined amount of time of the time of occurrence of the master clock if any one of said times of occurrence under the control of one of the slave clocks differs from the time of occurrence under the control of the master clock by more than a predetermined amount of time, and means for controlling the comparison means and the time control means until the slave clocks are phase-locked.

DETAILED DESCRIPTION OF THE PREFERRED EMBODIMENT OF THE INVENTION

Figure 1:
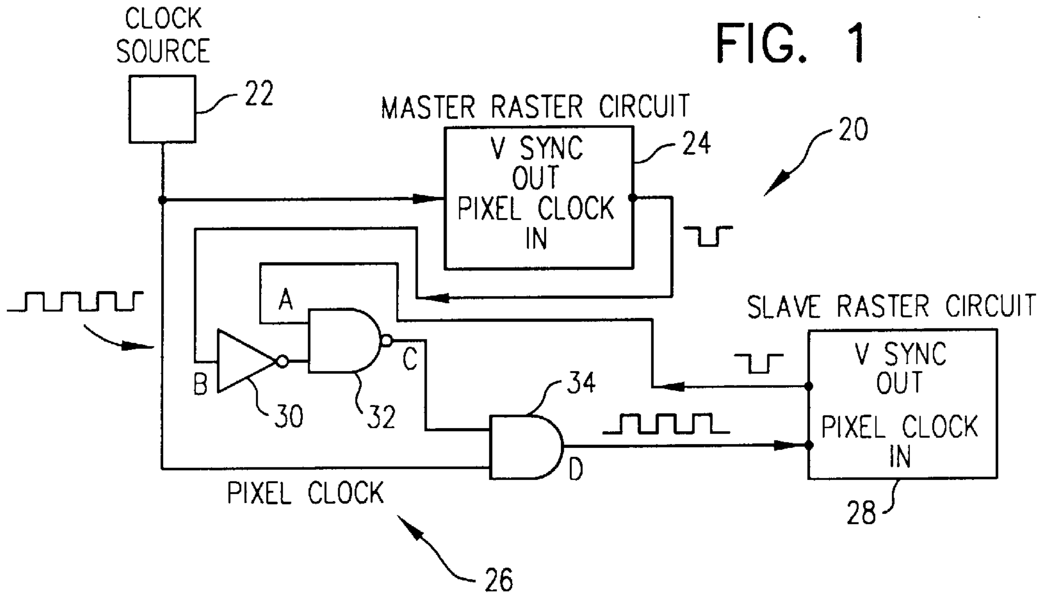
FIG. 1 is a schematic block diagram of a preferred embodiment of the inventive synchronization circuitry.

It would be helpful to provide pixel raster image video game electronics that can be inexpensively added to personal computers (PCs). In particular, one form of the electronics would provide high speed video with overlays and multiple phase-locked monitors for PCs. Such electronics would allow PC users to have high speed games, multiple monitor computer-aided design (CAD) systems and general purpose multi-monitor computer work stations. The speed, resolution and color of PCs using such systems will be superior to state-of-the-art systems.

The purpose of one aspect of the invention is to synchronize, and to vertically and horizontally phase lock raster scan video images so that one image can be laid on top of another image. This method, and the apparatus for accomplishing it, can be inexpensively applied to many types of video signal creation electronic systems, such as those the use digital electronics to count video pixels and video lines in raster. The inventive video signal creation electronic systems can then be synchronized, so that one raster image can be laid on top of another raster image at a low cost.

One advantage of this inventive system is that its general purpose application video sources use digital circuitry. These video sources can synchronized and phase-locked for any number of purposes that include 1) overlaying images and 2) synchronizing multiple video displays. If done properly, synchronized multiple displays do not cause human eye fatigue. Also, multiple video displays can show large images that require more than one display to view the image.

The inventive video synchronizer and phase-locker is a “pixel clock subtractor”. That is, this circuit blocks pixel clocks from a raster scanning circuit of the type that scans a computer type memory or video camera light sensitive transistor cell array. By blocking pixel clocks, a slave circuit, or multiple slave video raster circuits that use the same pixel clock source will slow down their horizontal pixel scanning and vertical line scanning until both the horizontal and vertical timing of the slave raster scanning devices match the horizontal and vertical timing of the master raster scanning device. Thus, the inventive circuit achieves synchronization and phase lock of any number of raster images to a master image.

In these applications, a problem arises in that almost all common raster scanning computer circuits use dynamic random access memory (DRAM). Video raster images contained in such memory require a period refresh signal to maintain the image. This refresh signal must be applied a the end of every horizontal line or the refresh period will be exceeded, and the image will be lost, or need recopying into raster image memory. The inventive pixel clock subtractor removes a small number of pixel clocks for each vertical rescanning of the raster until synchronization occurs. Computer raster image circuits typically take 1.5 seconds to synchronize with my pixel clock subtractor.

Synchronization takes place by removing only a small fraction of the total number of pixel clocks (which are fed to slave raster scan circuits) that comprise the phase time difference in the vertical phase lock. If vertical phase lock is achieved, then horizontal phase lock is also achieved because vertical timing is a division of horizontal timing. The divisor that determines the number of horizontal lines that create a vertical period is considered to be the same in the master and slave raster scanning devices. Also, the number of pixel counts in the horizontal lines is the same in both the master and slave raster scanning devices.

The inventive circuit makes one or more slave raster scanning devices match synchronization and vertical phase lock with the master raster scanning device. The vertical timing pulses from the two or more scanning devices are altered if necessary to make their wave shapes identical, squared and polarized negative within 1/4 pixel clock accuracy, if they do not already meet this requirement. Also the slave and master vertical pulses must be made to be at least one pixel clock wide.

Then a slave raster vertical pulse is compared to a master vertical pulse. Whenever the master raster vertical pulse width is present and the slave raster vertical pulse width is not present, the pixel clocks to the slave raster device are blocked. This results in two logical functions that occur at pixel clock speeds. First, at least some pixel clocks to the slave raster scanning devices are blocked, resulting in the phase difference of the master and slave raster scanning devices being able to be alter until there is no phase difference between them. Second, the pixel clocks are not ever blocked longer than the width of the master vertical sync pulse. Thus, no damage is done to the video image due to lack of DRAM refresh not occurring often enough.

FIG. 1 is a schematic block diagram of a preferred embodiment of the inventive synchronization circuitry. The pixel clock subtraction circuitry 20 includes a clock source 22, a master raster circuit 24, logic circuitry 26, and a slave raster circuit 28. The clock source 22 produces a first train of positive-going pixel clock pulses that are directed to the master raster circuit 24 and the logic circuitry 26. In response to the first train of clock pulses it receives, the master raster circuit 24 produces a pulse at point B in the logic circuitry 26. The logic circuitry 26, in turn, produces a second train of positive-going pulses (in a manner to be described subsequently) which are received to the slave raster circuit 28. In response to the second train of positive-going pulses, the slave raster circuit 28 produces a pulse at point A in the logic circuitry 26.

The pixel clock subtractor circuit is designed to use negative-going vertical synch pulses at points A and B in the logic circuitry 26 as the data input to synchronize the two raster scan circuits (master and slave raster circuits 24 and 28). The pulse at B is the master vertical signal and the pulse at A is the slave vertical signal. The pulse at B is inverted by an inverter 30 and that result is NANDed with the pulse at A by a NAND circuit 32. The output signal from the NAND circuit 32 (at point C in the logic circuitry 26) will always be high unless the master vertical pulse signal is low (i.e., during the vertical synchronization pulse) and the slave vertical pulse signal is high (i.e., not during the vertical synchronization pulse). The output signal from the NAND circuit 32 then passes to an AND gate 34 that is also in the logic circuitry 26. The AND gate 34 also receives the first clock pulse train from the clock source 22. Effectively, then, the output signal from the NAND circuit 32 causes the AND gate 34 to gate the first clock pulse train to the slave raster circuit 28.

The pixel clock subtractor passes or blocks clock pulses to the slave raster circuit 28. In this respect, the pixel clock subtraction circuitry 20 is circular. That is, the pixel clock subtractor can block clock pulses to the slave raster circuit 28, and all outputs of the slave raster circuit 28 are based on its counters, counting the input pixel clock. Standard Boolean logic methodology cannot be used to solve the logic equations for this circuit due to the circular functionality of the slave raster scanning circuit and the pixel clock subtractor. The width of the vertical synchronization pulse from the master raster circuit 24 is the maximum amount of time that the pixel clock subtractor and block clock pulses. This is critically important to common DRAM memory used in video cards, computers, video games, flight simulators and numerous modern electronic products.

If synchronize and phase lock circuits block pixel clocks in a single-pass, until phase lock of a typical computer or game display occurred, the time for which the DRAM memory could hold the images without refresh pulses would be exceeded, and image data would be damaged. This is typically the case since almost all modern video circuits use the raster scan circuit to also refresh the DRAM. The DRAM refresh function will not work if pixel clock pulses are blocked to the raster scan circuit for too long a period.

The pixel clock subtraction circuitry 20 is not symmetric. The pulses produced by the master and slave raster circuits 24 and 28 cannot be interchanged at the points B and A in the logic circuitry 26. Also, the polarity of the vertical synchronization pulses must be negative. Even if the polarities of both are made positive, the slave raster circuit 28 will lock-up, since pixel clock pulses to it will be forever blocked. If positive vertical pulses are used, then the end of the slave vertical pulse is required to terminate pixel clock blocking. This happens because the slave raster circuit 28 cannot create the end of its vertical synchronization pulse when its inputs are blocked.

As a result of this synchronization method and apparatus, expensive raster scanning circuitry is not necessary. This expensive raster scanning circuitry has 1) a resettable horizontal total, 2) a horizontal start counter (where horizontal blanking ends), 3) a horizontal end counter (where horizontal blanking begins), 4) a horizontal synchronization start counter, 5) a horizontal synchronization end counter, 6) a vertical total counter, 7) a vertical start counter (where vertical blanking stops), 8) a vertical stop counter (where vertical blanking begins), 9) a vertical synchronization start counter, and 10) a vertical synchronization end counter. The inventive pixel clock subtractor blocks pixel clocks to the slave raster circuit until the master and slave are in synchronization and phase lock, to the accuracy of zero clock cycles.

The present invention makes manufacturing video output devices that have overlaid video or multiple synchronized video outputs less expensive to build. Such devices include computer video games, computer video cards, or any digital video system that uses counters to create vertical and horizontal times. This lower build cost is accomplished by using the pixel clock subtractor and two or more raster scanning circuits that have the same vertical period. Theoretically there is no limit to the number of video raster circuits that could be synchronized and phase locked, with each slave raster scan circuit requiring a pixel clock subtractor to synchronize and phase lock it with the master.

This has ramifications that many more overlay and multiple synchronized and phase-locked video output circuits may come to market because of this low-cost synchronization methodology. This is very significant since numerous existing raster scan circuits that could not be synchronized and phase-locked in the past may be now, with the inventive circuit.

Also critically important is that the inventive circuit is completely compatible with DRAM refresh. The pixel clock subtractor never removes enough clock pulses in a signal cycle of its operation to detrimentally block the slave raster scan circuit from sending refresh pulses to its DRAM. Thus inexpensive DRAM can be used with this pixel clock subtractor. This is in consideration of the fact that typical, affordable raster display systems use the raster scan circuit to perform the DRAM refresh function.

The inventive circuit can, for example, be made using programmable logic devices with blown security fuses, although other methods well-known to those skilled in the art could also be used.

The raster scan circuit synchronization and phase lock is accomplished by the combination of the pixel clock subtractor and any two raster scanning circuits that have the same vertical period for the same pixel clock frequency. The easiest way to accomplish this circuitry is to use two inexpensive video raster scan circuits of the same design. In this way, the vertical synchronization pulse shape is already the same from each circuit, and the horizontal and vertical counters of the circuit are set to trigger on the same count.

The horizontal and vertical counters do not necessarily have to have the same count settings. However, this will allow the circuit to have fewer components, since no pulse width wave shaping will be required to make the vertical synchronization pulse widths the same. Also, the circuitry will be easier to build if both raster scan circuits have negative-going vertical pulses.

Once both raster scan circuits are functioning from the same source, they automatically come into synchronization, but not phase lock. If the pixel clock subtractor is switched in, the slave raster scan circuit will phase lock to the master scan circuit (typically in 1.5 seconds), as small groups of pixel clocks are subtracted during each vertical period of the scan circuits, until the total phase difference has been subtracted out.

The first embodiment of the circuit was built using two identical IBM PC-compatible VGA video raster scan circuits, each contained in a single large scale integrated (LSI) circuit. The pixel clock subtractor was programmed into a programmable logic device to create the necessary logic gates. This entire circuit was built by using a combination of two existing printed circuit boards that each had a VGA compatible raster scan integrated circuit (IC) on them and a wire-wrap prototype board containing the programmable logic device. One VGA raster IC was used as a pixel clock source for itself (the master) and for the clock source to be passed through the pixel clock subtractor. The result that comes from the pixel clock subtractor is sent to the slave raster circuit as its pixel clock. Other, equivalent, methods could also be used to practice the invention, as will be known by those skilled in the relevant arts.

Because the design accomplishes high speed video with overlays and multiple phase lock monitors for common PCs, PC users can now have high speed games, multiple monitor CAD systems and general purpose multi-monitor computer work stations at a lower build cost than can presently be accomplished. Games that are improved by overlaying the phase locked rasters for PCs would have superior speed, superior resolution and superior color than the current state of the art.

In the prototype that was built, the addressing to the two identical video raster scan circuits was modified to avoid bus address conflicts. Software was written and executed to switch the phase locking video modes on and off to prove phase lock would be obtained properly and with repeatability. Listings of the software used are given in Appendices I and II, which follow. The software described in these listings will be understood by those skilled in the relevant computer programming arts and equivalent subroutines to those shown could be substituted without drastically deteriorating the performance of the circuit. Tests were also performed to overlay the video signals from the two phase-locked video raster circuits. Tests were also performed to phase lock, to release phase lock, and to re-obtain phase lock reliably. The clock speed used in these tests was 12.5 MHz, although the circuitry could easily be modified to perform at substantially higher speeds. At these speeds, the circuitry provided phase locked images from the raster circuits of 320 horizontal pixels by 240 vertical pixels. Subsequent tests operated at 25 MHz and provided phase locked raster images up to 640 horizontal pixels by 480 vertical pixels.

Software for driving the displays that can adapt to changes in the software that produces the information or images to be displayed is also important. In accordance with the present invention, driver software can be decomposed into multiple layers. This multi-layer type of driver comprises two or more distinct video software driver programs. One benefit of such a type of driver is reduced cost of development, since the multi-screen or "logical screen" handling is done first by a master driver.

The master driver separates video commands from applications and the operating system to a smaller single screen area, and then sends a single screen command to a second "lower level" video driver program. This program communicates with the video controller hardware to do tasks such as, but not limited to, changing registers in the video controller(s) to change resolutions, color depth, color modes and sweep rates, as well as drawing a multi-screen video system on a computer display system.

The multi-layer driver program typically also has the task of loading one or more copies of the lower level drive at boot up time of the multi-tasking, multi-monitor computer system.

All video commands pass through the master video driver before altering those commands and passing them on to a lower level driver that communicates directly with the video hardware.

The lower level driver is actually a "single video controller driver" and typically has no code dealing with the management of multiple video controllers. It operates as if there is just one video controller, the one it is presently working with.

The master video driver in some less demanding cases communicates with hardware, where it also manages a memory map bank switcher. The purpose of the bank switcher is to control which video controller the lower level driver(s) communicate with. This is done in systems where the video controller hardware ICs do not have the feature of re-mapping to new memory map locations, and accordingly, two or more video controller ICs map on top of each other. This would cause a hardware crash, if not for the higher level driver having one video controller IC "turned on" to communicate with the computer's bus at any one time.

In most cases the master video controller only communicates with the lower level drivers that are set up, at boot time, to communicate with video controllers that have been relocated in the memory map, also at boot time.

Typically this relocation is managed by the ROM low level system manager of the computer when booting. While it may not be new for a computer to have relocatable hardware at boot time, it is a new use of the relocatable hardware to set up video controllers in different locations, typically above the last of regular computer memory.

In personal computers of the "IBM PC type", typically one video controller is left in its original default low memory location, in order to make this computer system backward compatible to older, direct video communication programs such as those that commonly ran under older, simpler operating systems.

It is dramatically cheaper to develop a master video driver that communicates primarily with lower level drivers. Low level drivers that have such tasks as, but not limited to changing registers in the video controller(s) to change resolutions, color depth, color modes and sweep rates, also drawing a character's drawing lines, filling blocks with color, or moving blocks of image, are very expensive to create. This is because they handle the complex tasks of drawing image in video memory and even using special hardware within the video controller IC often called "accelerators" or "blitters" (block line transfer). This special hardware can be set up via controlling register to perform many repetitive copying or drawing functions to video memory as fast as possible. The "accelerators" or "blitters" are faster at these repetitive tasks than software. However it is a time consuming task to create a reliable driver that uses such hardware.

Another benefit of the multi-layer video driver method is that is possible that it can then use multiple video controllers that are different models and are made by different manufacturers. Accordingly, master driver managing drivers allow video controller "1" manufactured by company "A" and video controller "2" made by company "B" to be used side by side in multi-tasking multi-computer monitor systems. The low drivers are typically created by company "A" and customized for video controller "B". Theoretically, the number of different low level video drivers being managed by the master is unlimited. Thus many screens can be used.

A PC user may have the ability of retaining the use of an older, less resolution and color depth. Slower video, along with the new video controller, creates a multi-monitor system by way of having a master video driver and manages the lower level drivers. Such a system may even have the older video controller (which typically has fewer features) be the video controller that cannot be re-located (since it lacks this feature). Thus, the new video controller(s) would be relocated to higher memory map positions.

A master video driver may also make direct contact with hardware to set up or control phase locking of the multiple video controllers. It is a desirable feature in a multi-monitor system to have the multiple monitors running at the same sweep rates and to be vertically and horizontally phase locked in order to be more pleasing to the human eye. The master video driver may have code within it to do this, or this may be done by additional driver code loaded for just this purpose.

Phase-locking of multiple screens can also be accomplished by a software method. In a preferred embodiment of the software, which is typically capable only of near phase vertical locking, phase-locking is accomplished by reference to registers. A typical 60 Hz vertical screen scan is done in 18 milliseconds. Another out-of-phase display device can therefore be between 0 and 18 ms out of phase. The software method to be described reduces the out-of-phase condition to 1 ms, and sometimes to 35 microseconds.

Virtually every SVGA video controller chip has a register that can be polled to ask whether vertical blank time has occurred in the last 2 ms. This is because vertical blank time averages about 2 ms on most video systems, and is the time the electron beam is off-screen vertically, in the over-scan area of the display. The vertical blank time is a good period to update video image information in a way the user won't see. The video blank event can also be known to a computer program via a "vertical blank interrupt" (VBI) which is better and more exact than register polling. VBI is also used to change screen data in a way the user won't see.

It is possible to use the vertical blank time by polling for this event or by interrupt, to trigger a small program that will "near" vertically phase lock two or more screens whose video controllers can all be accessed from the same computer program. These are typically multiple video controllers, attached to the same computer system. The goal of this process is to get rid of the darkened horizontal band across multiple video screens, caused by being close to each other and having vertical synchronization start at different times. In addition, it is very important that motion graphics (used especially in games and movies) that cross over a multi-screen boundary have multi-screen image updates to have vertical phase lock. This is done to avoid an image jitter or image tearing effect to the human eye, caused by image updates being shown on one or more of the screens, or by updating at different vertical blanks for the different screens.

To achieve vertical phase locking, the following operations are performed:

1) The base clock of all the video controllers must be the same since, otherwise, the system will become un-synchronized and lose phase-lock in a short amount of time. All screens (video controller chips) must be put in sufficiently similar video modes such that sweep rate of the screen, vertical line counts and horizontal pixel counts are the same. This will keep the undesirable horizontal darkened bar from rolling, because the screens are now refreshing at the same rate (i.e., they are synchronized). The rest of the process is to get the screens also in phase (or nearly in phase), besides being synchronized.

2) Declare one of the screens (video controller) to be the master synchronization source. The other screens are slave screens.

3) Set up a vertical blank polling or vertical blank interrupt to execute a small computer program, when the vertical blank occurs.

4) Perform the following steps:

4.1) Test one or more slave screens (video controllers) to see if their vertical blank time has also just started. This can be done with polling or by way of interrupt. If the vertical blank time is also "now", as it is "now" for the master, then do nothing, and jump to the end of the program. If not, then go through the following steps:

4.2) It will temporarily set the vertical and/or horizontal count compare register in the slave screens (video controllers) to zero or a very low number such as 1, 2, 3, . . . This will cause the vertical and/or horizontal counter to be reset in a short period of time.

4.3) Then wait a specified amount of time, generally just longer than one vertical line period (typically 63.5 microseconds to as fast as 15 microseconds).

4.4) Then, at the end of this wait period, return the vertical and/or horizontal count compare register values to their original values.

4.5) Finally, exit the program that was triggered by the vertical blank period. The result is that the slave screens (video controllers) are now within a few horizontal lines of vertical phase lock, or at least closer than they were. Following vertical blank triggerings of this program will bring the slave screens to within a few horizontal lines of vertical phase lock and then stop the process. The program will typically be triggered to run several hundred times, during the first several seconds of time after it is turned on to search for vertical blank by polling or interrupt.

Another software method is to use slave video controllers that have a hardware feature commonly referred to a "genlock". This means that its vertical and horizontal video pixel position scan counters are resettable. That is, they can be instantly zeroed by an electrical pulse of software command. Again, this system requires that the base clock of all the video controllers (master and slaves) is the same; otherwise the system will become un-synchronized and lose phase lock in a short amount of time.

This software method is easier than that described above. However, adding genlocking to video controllers adds a financial cost to each one. However, like the previous method, all screens (video controller chips) must be provided with sufficiently similar video modes so that the sweep rate of the screen, vertical line counts and horizontal pixel counts are the same. This will now keep the undesired horizontal darkened bar from rolling, as the screens are now refreshing at the same rate (i.e., they are synchronized). The rest of this software method assumes that the screens are in phase or nearly in phase, besides being synchronized.

When vertical blank time of the master video controller is found via polling or vertical blank interrupt, a small program is triggered. This small program commands a genlock reset of the counters in the slave video controllers. While not perfect, this method is able to achieve near-phase locking.

When the vertical blank time is sensed from the master, via polling or interrupt, then the program tests the slave screens (video controllers) to see if the screens are more than a few horizontal lines out of phase. If they are, then a software command instructs the slave screens (video controllers) to reset their counters. If they are not, then the program is finished, since the master and slave screens (video controllers) are already synchronized.

When the screens are synchronized, the program will typically execute only one time, since only one cycle of the program is needed to achieve near-phase locking of the screens.

There is yet another software method that can improve the horizontal phase lock accuracy after vertical phase lock accuracy has been done as well as possible. Its purpose is to get rid of the undesired vertical shadow bar on the screens of two or more monitors that are in close proximity, caused by the horizontal synchronization pulse being out of phase.

A fine tuning of the horizontal phase lock can be done with the aid of software and human interaction with the software. The operator can engage a program that will temporarily zero the horizontal counter of a slave screen (video controller) via a software genlock zeroing command or by placing a low value into the horizontal counter compare register. If the method was to place a low value in the horizontal counter compare register, then the normal values is restored within several microseconds. This can have the effect of walking the undesired vertical shadow bar across the screen via key hit command by the user, until it is off the viewable area of the screen. The user may need to his this key several times to achieve the desired effect. Again, this system requires that the base clock of all the video controllers (master and slaves) is the same; otherwise the system will lose synchronization and phase-lock in a short period of time.

A further form of phase-locking also exists: hardware phase locking. Hardware phase locking is any phase locking that is done by method of genlock circuits (resettable vertical and horizontal pixel position counters) or by digital PLL (phase-lock loop) circuits that remove pixel clocks to phase-match the vertical and/or horizontal counters of any number of slave screen (video controllers) with a memory and internally have many registers and color pallet values held in DRAM cells. These cells must be refreshed regularly or will lose their values.

This amount allows the period of time of the width of the vertical synchronization pulse to also be the limited amount of time that DRAM refreshes within the video controller and the DRAM memory it controls to be refresh delayed.

The software controlling this hardware PLL method can be built into a high level multi-screen video driver or high level driver add-on. A software video driver can be a single layer driver (i.e., one distinct program acts as the entire video driver) or the high level multi-screen video driver that handles the concept of individual logical screens comprising a larger desktop area for a computer running a multitasking operating system. However, once the video command is divided to a single screen size command, that command is sent to a simple single head software video driver. The single video head software driver typically contains the large body of code that actually communicates with the video controller hardware.

This type of driver includes two or more distinct video software driver programs. It has the benefit of cost reduction of development, since the multi-screen or "logical screen" handling is done first by one driver, which separates that video command to a single screen area, and then sends a single screen command to a second video driver program that communicates with the video controller. This communication is used to do tasks such as, but not limited to, drawing a character, drawing a line, filling a block with color, or moving a block of image. Then, if necessary, the first driver sends more commands to yet another video driver that communicates with another video controller to complete more drawing of what was originally a single drawing command created by an application program that may have crossed over one or more screens of a multi-screen video system on a computer.

Figure 2:
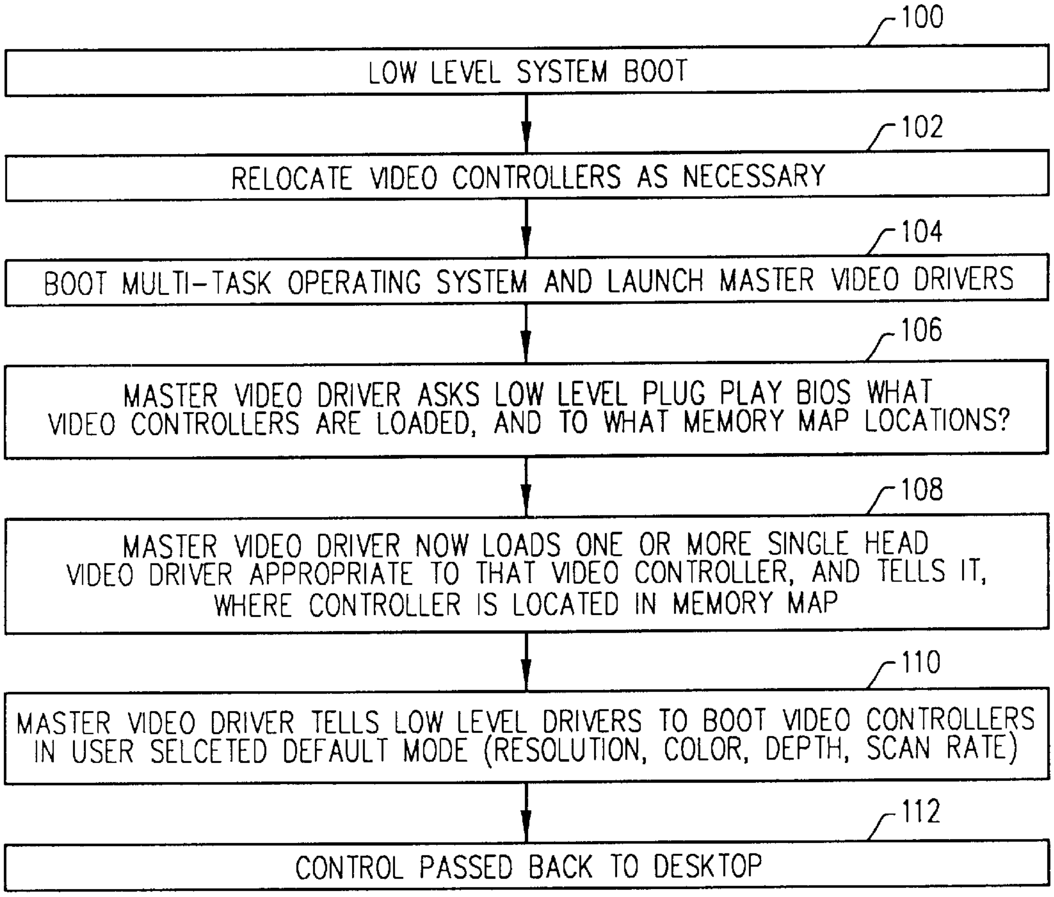
FIG. 2 is a flow chart of first portion of the software in accordance with an aspect of the present invention.

FIG. 2 is a flow chart of first portion of the software in accordance with an aspect of the present invention. In block 100, a low level system boot occurs. Next, in block 102, the video controllers are relocated, as necessary. Following relocation of the video controllers, a multi-tasking operating system is booted and master video drivers are launched (block 104). The master video driver then interrogates low-level plug-and-play BIOS to learn which video controllers are loaded and where they are located in memory (block 106). The master video driver then loads one or more single head video drivers that are appropriate to a particular video driver and tells the video drivers where the controller is located in the memory map (block 108). Next, the master video driver tells low level drivers to boot video controllers in user-selected default mode (including resolution, color depth, and scan rate) (block 110). Control of the computer is then passed back to the desktop (block 112).

Figure 3:
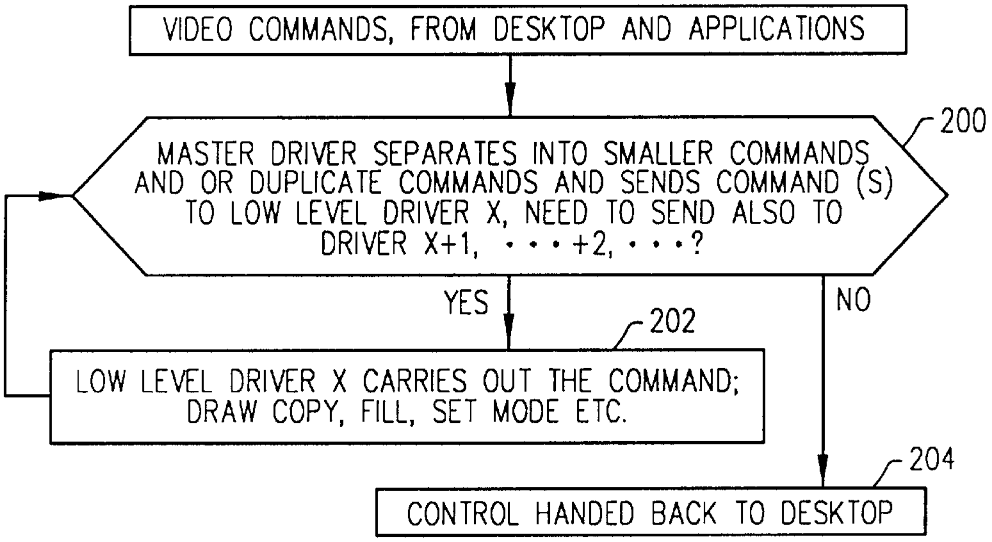
FIG. 3 is a flow chart of second portion of the software in accordance with an aspect of the present invention.

FIG. 3 is a flow chart of second portion of the software in accordance with an aspect of the present invention. This second portion of the software describes the passage of video commands from the desktop and applications. In decision block 200, the master driver separates commands into smaller commands (or duplicate commands) and sends them to one of the low level drivers. It then inquires whether there is the need to send further commands to other drivers. If so, the program proceeds to block 202; otherwise the program goes to block 204. In block 202, the low level driver to which the commands were just sent carries out the commands. Then the program returns to decision block 200. On the other hand, in block 204, control of the computer is passed back to the desktop.

Figure 4:
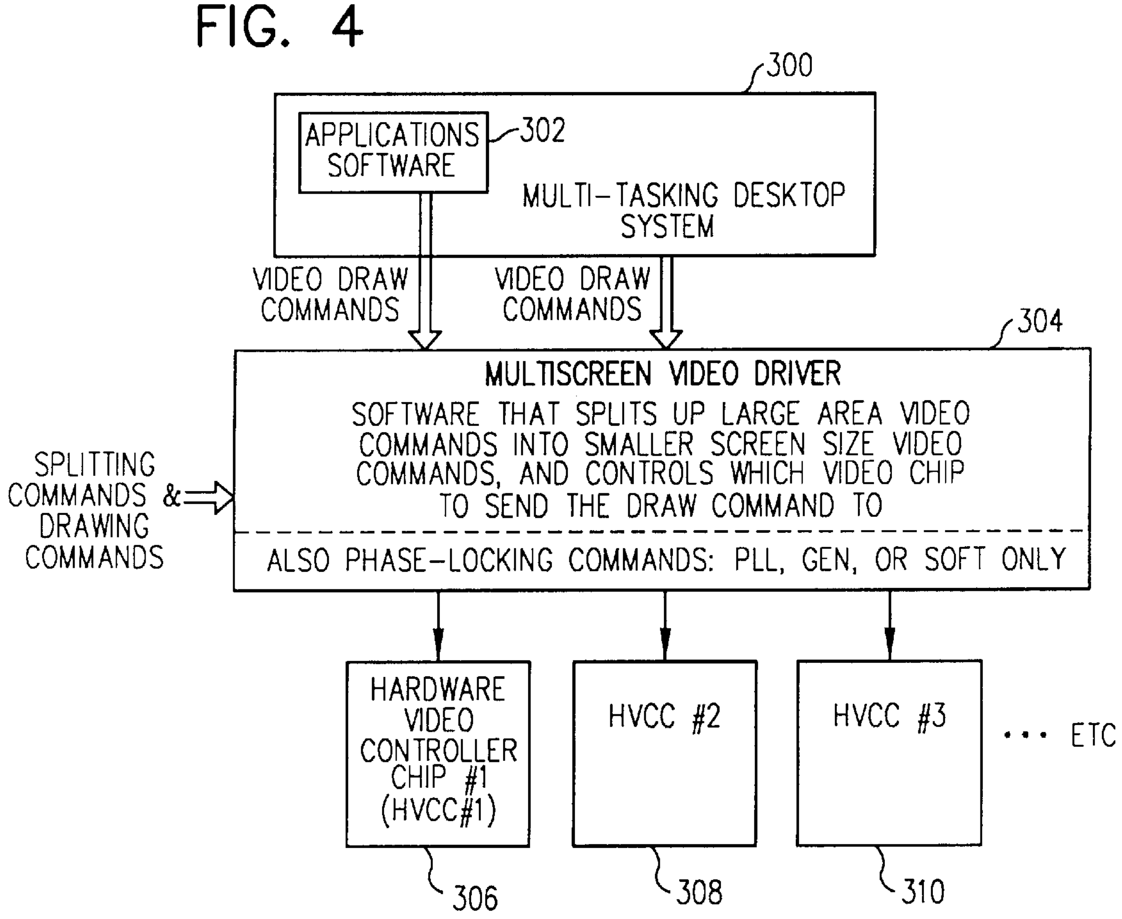
FIG. 4 is a flow chart of software in accordance with a first preferred embodiment of the present invention.

FIG. 4 is a flow chart of software in accordance with a first preferred embodiment of the present invention. The multitasking desktop system 300 contains an application 302. Both the desktop system 300 and the application 302 send video draw commands to multi-screen video driver software code 304. Code 304, in response to splitting commands and drawing commands, splits up large area video commands into small screen size video commands. The code 304 also controls which of the video chips (HVCC#1 306, HVCC#2 308, and HVCC#3 310, et cetera) to send the draw command to and issues phase-locking commands, such as phased-locked loop, gen-lock, or software commands.

Figure 5:
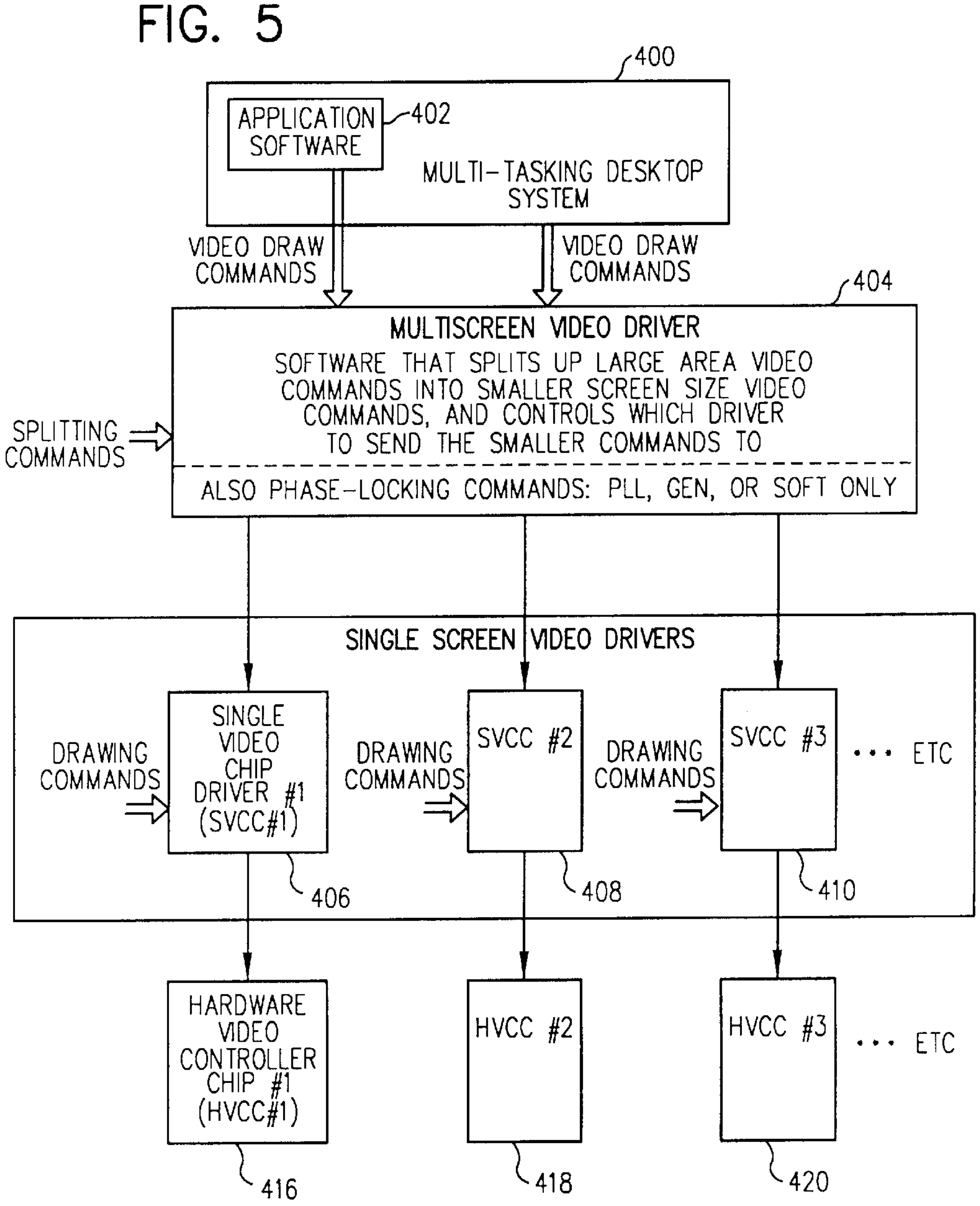
FIG. 5 is a flow chart of software in accordance with a second preferred embodiment of the present invention.

FIG. 5 is a flow chart of software in accordance with a second preferred embodiment of the present invention. The multitasking desktop system 400 contains an application 402. Both the desktop system 400 and the application 402 send video draw commands to multi-screen video driver software code 404. Code 404, in response to splitting commands, splits up large area video commands into small screen size video commands. The code 404 also controls which of the single video chip drivers (SVCC#1 406, SVCC#2 408, and SVCC#3 410, et cetera) to send the draw command to and issues phase-locking commands, such as phased-locked loop, gen-lock, or software commands. The SVCCs 406, 408 and 410 also receive drawing commands. After the SVCCs 406, 408 and 410 have received the phase-locking commands and drawing commands, they then issue commands to the hardware video controller (HVCC) chips 416, 418 and 420, respectively.

Figure 6:
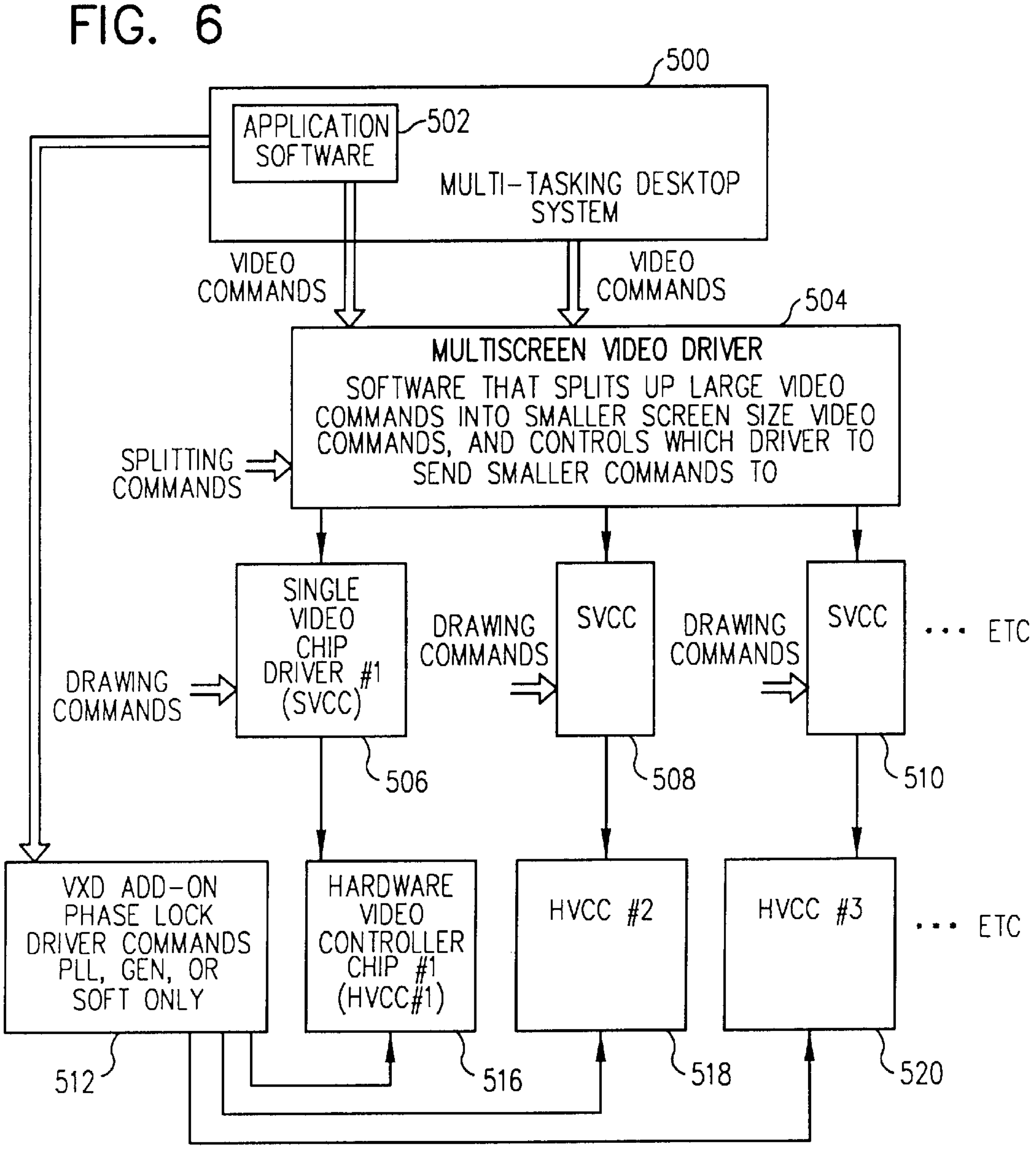
FIG. 6 is a flow chart of software in accordance with a third preferred embodiment of the present invention.

FIG. 6 is a flow chart of software in accordance with a third preferred embodiment of the present invention. The multitasking desktop system 500 contains an application 502. Both the desktop system 500 and the application 502 send video draw commands to multi-screen video driver software code 504. Code 504, in response to splitting commands, splits up large area video commands into small screen size video commands. The code 504 also controls which of the single video chip drivers (SVCC#1 506, SVCC#2 508, and SVCC#3 510, et cetera) to send the draw command to. The SVCCs 506, 508 and 510 also receive drawing commands. The application 502 also issues phase-locking commands, such as phased-locked loop, gen-lock, or software commands, to phase-lock code 512. After the SVCCs 506, 508 and 510 have received the drawing commands and the phase-lock code 512 has received the phase-locking commands, they then issue commands to the hardware video controller (HVCC) chips 516, 518 and 520, respectively.

Figure 7:
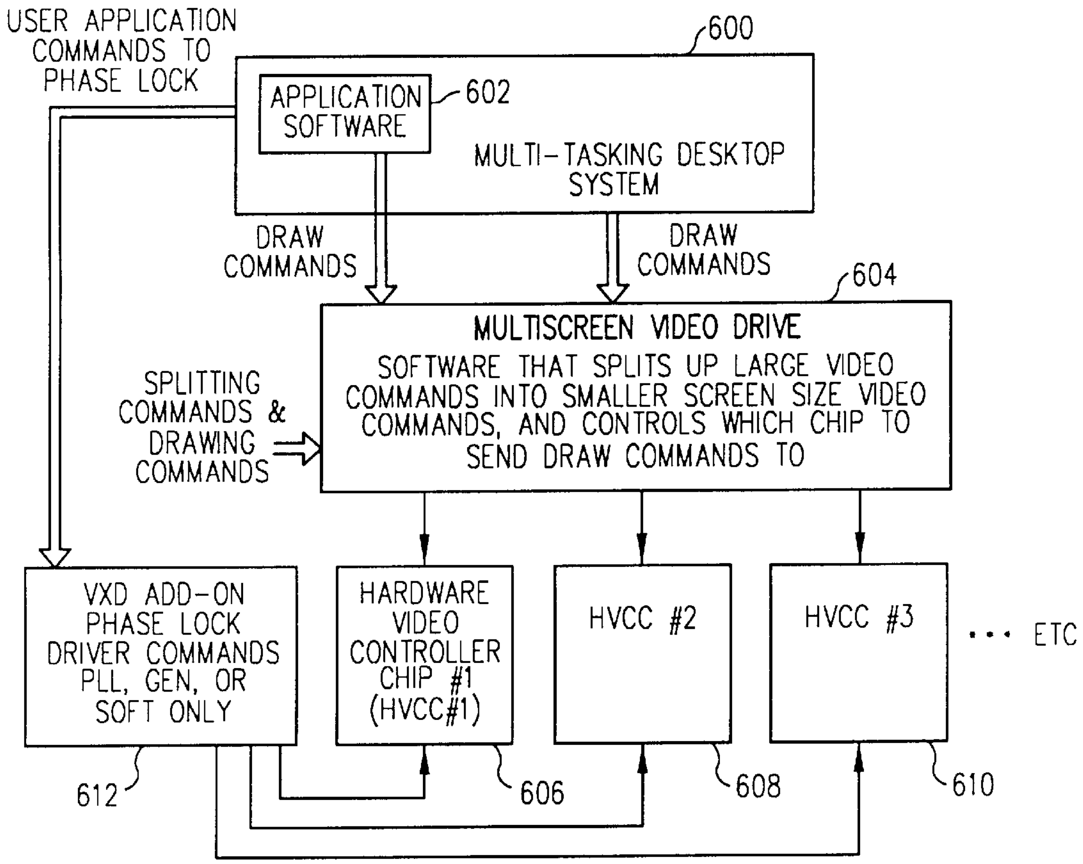
FIG. 7 is a flow chart of software in accordance with a fourth preferred embodiment of the present invention.
Figure 14A:
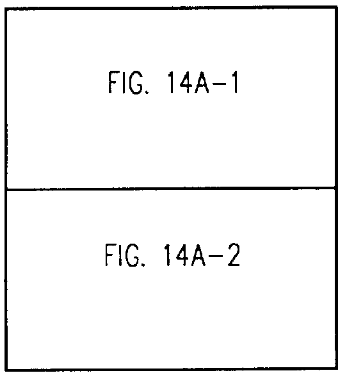
FIG. 14 is a schematic diagram of an exemplary display of a graphic images over several display devices.

FIG. 7 is a flow chart of software in accordance with a fourth preferred embodiment of the present invention. The multitasking desktop system 600 contains an application 602. Both the desktop system 600 and the application 602 send video draw commands to multi-screen video driver software code 604. Code 604, in response to splitting and drawing commands, splits up large area video commands into small screen size video commands. The code 604 also controls which of the hardware video controller chips (HVCC#1 606, HVCC#2 608, and HVCC#3 610, et cetera) to send the draw command to. The application 602 also issues phase-locking commands, such as phased-locked loop, gen-lock, or software commands, to phase-lock code 612. After the phase-lock code 612 has received the phase-locking commands, it then issues phase-lock driver commands to the hardware video controller (HVCC) chips 606, 608 and 610, respectively.

Figure 8:
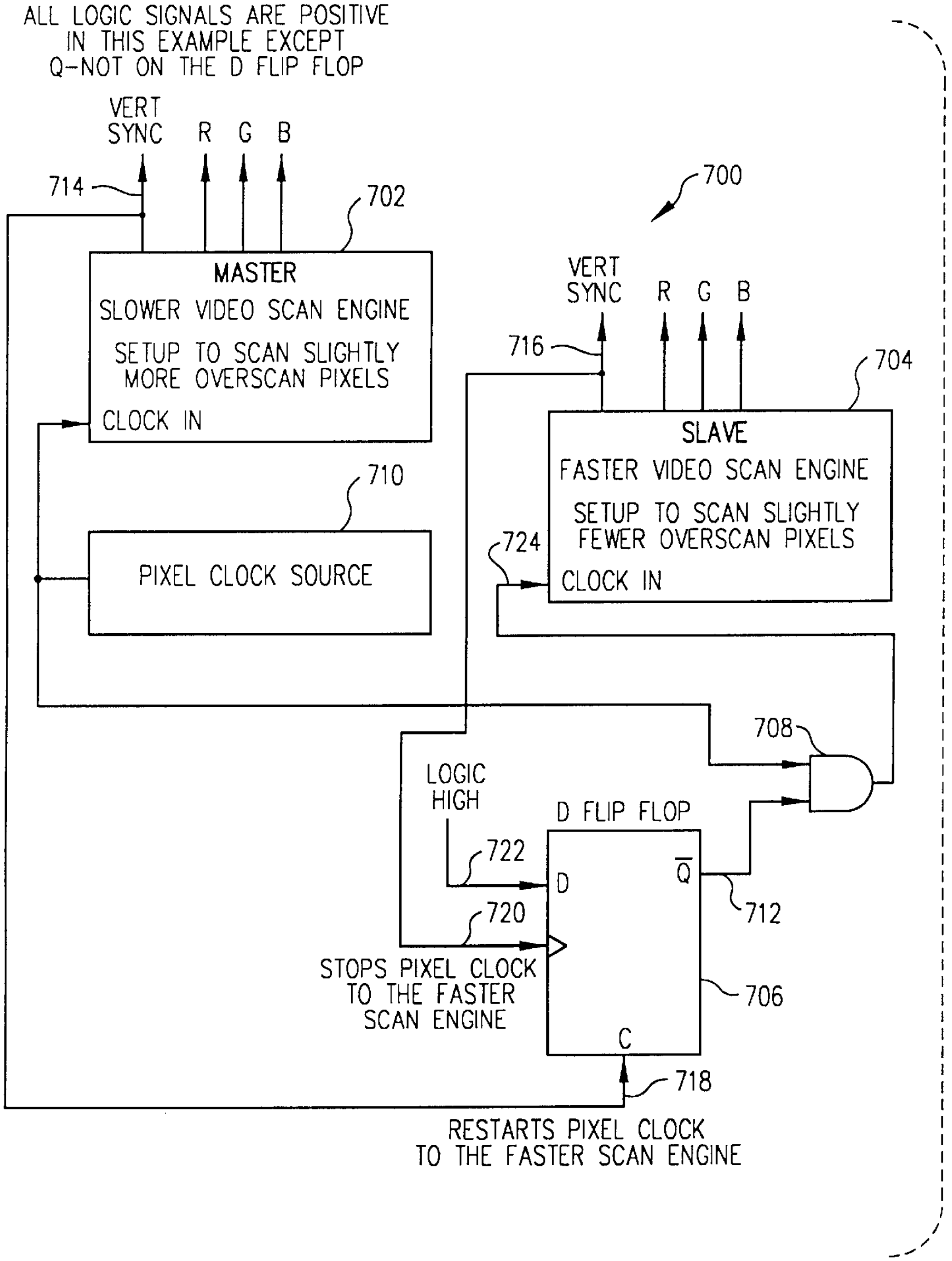
FIG. 8 is a schematic block diagram of a second preferred embodiment of the inventive synchronization circuitry.

FIG. 8 is a schematic block diagram of a second preferred embodiment of the inventive synchronization circuitry. The circuitry 700 includes a master raster circuit 702, a slave raster circuit 704, a D flip-flop circuit 706, a logic gate 708, and a clock source 710. All logic signals in FIG. 8 are positive except the signal on Q-not 712 in the D flip-flop circuit 706. The clock source 710 is connected to both the master raster circuit 702 and the logic gate 708.

The master raster circuit 702 has a slower scan rate than does the slave raster circuit 704. Further, the master raster circuit 702 is setup to scan slightly more overscan pixels that is the slave raster circuit 704. The outputs from the vertical sync outputs 714 and 716 of the master raster circuit 702 and the slave raster circuit 704, respectively, are fed to the D flip-flop circuit 706. The signal on the vertical sync output 714 is connected to the C input 718 of the D flip-flop circuit 706, while the signal on the vertical sync output 716 is connected to the input 720 of the D flip-flop circuit 706. The signal on the D input 722 of the D flip-flop circuit 706 is set to logic high.

The signal on the C input 718 restarts the pixel clock to the slave raster circuit 704, which is the faster scan engine, while the signal on the input 720 stops the pixel clock to the slave raster circuit 704. This is accomplished by the logic gate 708 combining the output of the pixel clock source 710 and the Q-not output 712 of the D flip-flop circuit 706. The output of the logic gate 708 is connected to the clock in pin 724 of the slave raster circuit 704.

The circuitry just described applies to video controllers of the types that are multiple controllers, one per chip, or multiple video controllers, more than one per chip. The previous method is for video controllers that are already in sync, but not in vertical or horizontal phase lock, whereas the present method is intended for video controllers (also known as scan engines) that are not phase-locked vertically or horizontally and also not in sync, meaning that the time for each scan engine to scan a CRT or LCD screen is not equal. This produces the commonly-seen undesirable effect of rolling bars in the image to the viewer.

The present circuit accomplishes vertical phase locking by way of blocking pixel clock to the faster scan engine at the end of the screen scan and waits for the slower screen scan to catch up. The circuit is exercised for each scan of the screen.

The same circuit can be applied as an additional pixel clock blocker based on input from the two horizontal sync signals of the two scan engines in exactly the same fashion.

Any two or more video scan engines can be phase locked both vertically and horizontally with this same circuit. The phase-locking problem does not lend itself to t a Boolean solution as the output sync signals are the feedback to the phase-locking circuit.

Figure 9:
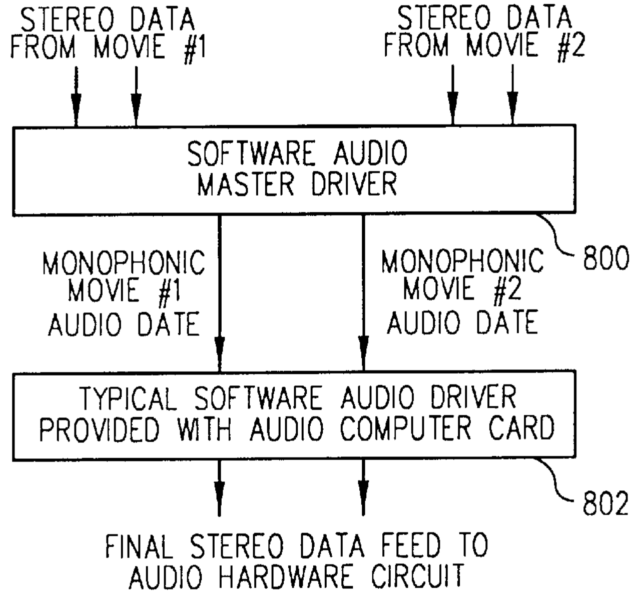
FIG. 9 is a schematic block diagram of a dual layered audio driver embodiment of the inventive synchronization circuitry.

FIG. 9 is a schematic block diagram of a dual layered audio driver embodiment of the inventive synchronization circuitry. Those skilled in the relevant arts will readily understnad this audio driver embodiment. This embodiment has drivers that are dual layered is order to achieve two monophonic audio outputs via stereo audio sound cards.

A master audio software driver intercepts two stereo or monophonic audio feeds and translates them to monophonic left and monophonic right audio data feeds.

Referring to FIG. 9, stereo data from two separate movie are received by a software audio master driver 800. The output of the software audio master driver 800 is two channels of audio data: one for monophonic movie #1 and the other for monophonic move #2. The output of the software audio master driver 800 is two monophonic movie audio data. These signals are received by a typical software audio driver 802 which produces final stereo data for you.

Figure 10:
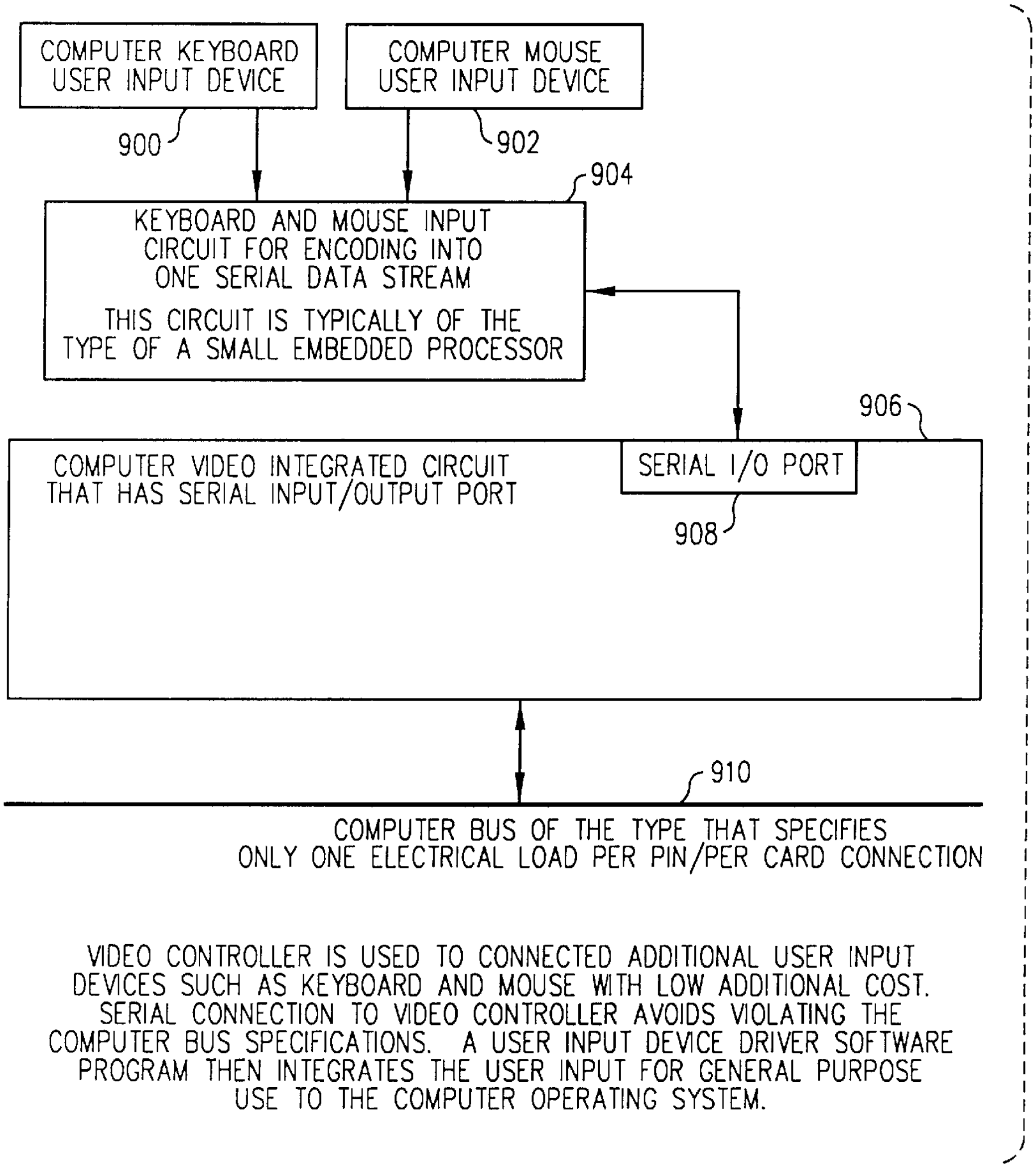
FIG. 10 is a schematic block diagram of a dual layered audio driver embodiment of the inventive synchronization circuitry.

FIG. 10 is a schematic block diagram of a dual layered audio driver embodiment of the inventive synchronization circuitry. This circuit can be used to connect additional user input devices such as a keyboard and a mouse with low additional cost. The signals from the computer keyboard user input device 900 and from the computer mouse user input device 902 are fed to a keyboard and mousse input circuit 904 for encoding into one serial data stream. The keyboard and mousse input circuit 904 is typical a small embedded processor. The keyboard and mousse input circuit 904 is connected to the computer video integrated circuit 906 having the serial input-output port 908. The computer video integrated circuit 906 is connected to a computer bus 910 of the type that specifies only one electrical load per pin/per card connection.

The video controller shown in FIG. 10 is used to connect additional user input devices at low additional cost. Serial connect to the video controller avoids violating the computer bus specifications. A user input device driver software program then integrates the user input for general purpose use to the computer operating system.

The video card may have one or more video outputs. The input device drivers allow customized software to have user entry without taking user interface control away from the main user of the computer.

Where the computer bus allows only one electrical load per pin, per card slot. The user input devices make connection to the computer through the I/O port on the video controller 906. The connection of the video controller 906 to the computer bus 910 is used to get data from the mouse and keyboard input devices. A computer that is multi-tasked in this way is made to become a multi-user computer system that also benefits from the second video output for the additional user(s).

Figure 11:
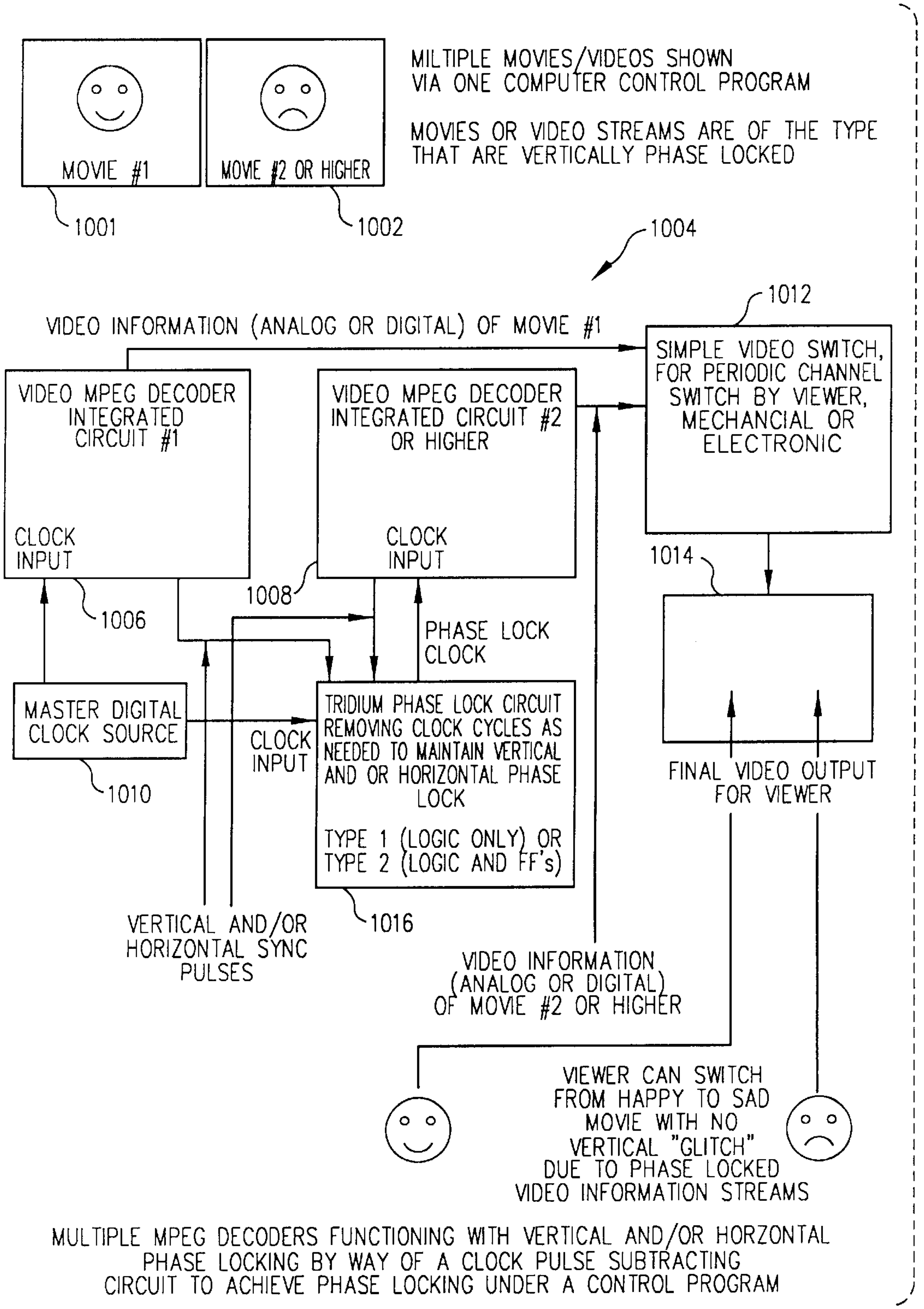
FIG. 11 is a schematic block diagram of a first embodiment of a multiple MPEG decoder.

FIG. 11 is a schematic block diagram of a first embodiment of a multiple MPEG decoder. The multiple MPEG data can be separate movies (or videos) 1000 and 1002, which are played via the control program of one computer. The decoder 1004 includes a first MPEG decoder 1006 and a second MPEG decoder 1008. The decoder 1004 also includes a clock source 1010, a phase lock circuit 1006, a simple video switch 1012, a final video out device 1014, and a phase lock circuit 1016.

The first and second MPEG decoders 1006 and 1008 receive signals from the master digital clock source 1010. The first MPEG decoder 1006 passes vertical and/or horizontal sync pulses to the phase lock circuit 1016 which, in turn, produces a phase lock clock signal that is received by the second decoder 1008 at its clock input. The phase lock circuit 1016 removes clock cycles as needed to maintain vertical and/or horizontal phase lock. The second decoder 1008 also passes vertical and/or horizontal sync pulses to the lock circuit 1016.

The outputs of the first and second MPEG decoder 1006 and 1008 are connected to a video switch 1012, which transmits a final video output for the viewer in accordance with the discussion above. The viewer can switch between programming without a vertical "glitch", which is due to phase-locked video information glitch due to phase locked video information streams.

The software provides the user a common menu for turning on, turning off and otherwise managing the playing of video (with and without audio), information from one source such as movie discs, data cable feeds, antenna input and modem data feeds. The one video source is sent to the different video output. This produces a larger video display area by combining multiple screen to be use.

This software also manages the recourses for the moving image player core code. Ths comprises resource management because video controllers have this same hardware such as color correction and motion correction. These duplicated resources are specifically managed to provide acceleration hardware for playing two or more video streams simultaneously. Whereas acceleration hardware circuit is decided by one motion video and another acceleration hardware circuit is dedicated to another motion video. Likewise, a computer mother board that has multiple processors and dedicated case memory with this process on it is specifically assigned to separate motion video play jobs (tasks).

Figure 12:
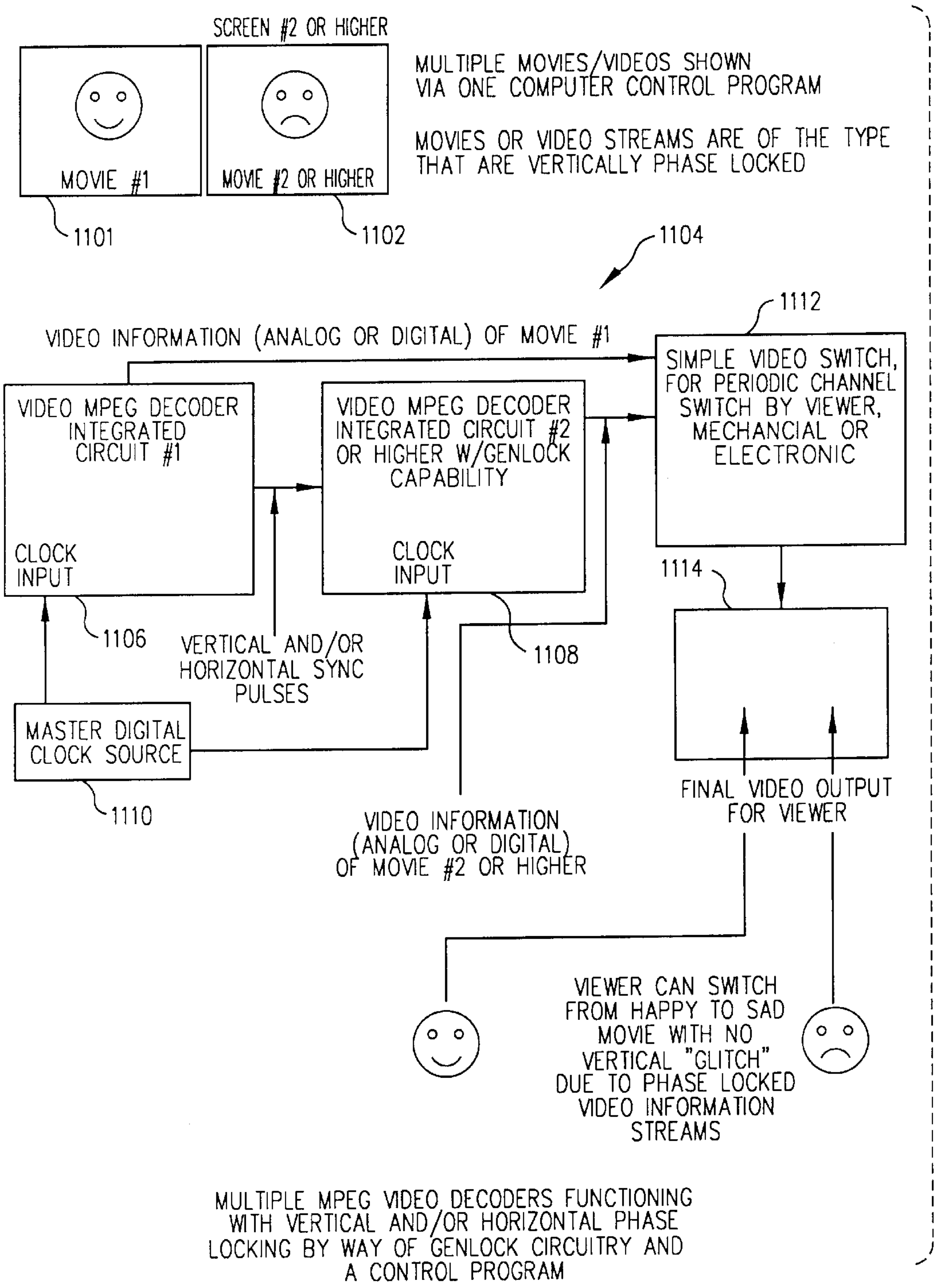
FIG. 12 is a schematic block diagram of a second embodiment of a multiple MPEG decoder.

FIG. 12 is a schematic block diagram of a second embodiment of a multiple MPEG decoder. The multiple MPEG data can be separate movies (or videos) 1100 and 1102, which are played via the control program of one computer. The decoder 1104 includes a first MPEG decoder 1106 and a second MPEG decoder 1108. The decoder 1104 also includes a clock source 1110, a simple video switch 1112, and a final video out device 1114.

The first and second MPEG decoders 1106 and 1108 receive signals from the master digital clock source 1110. The first MPEG decoder 1106 passes vertical and/or horizontal sync pulses to the second MPEG decoder 1108. The output from the second MPEG decoder 1108, in turn, produces video information (analog or digital) that is sent to the simple video switch 1112. The first MPEG decoder 1106 also produces video information (analog or digital) that is sent to the simple video switch 1112. The simple video switch 1112 then transmits the video to the final video output device 1114. The viewer can switch between programming without a vertical "glitch", which is due to phase-locked video information glitch due to phase locked video information streams.

As above, the software provides the user a common menu for turning on, turning off and otherwise managing the playing of video (with and without audio), information from one source such as movie discs, data cable feeds, antenna input and modem data feeds. The one video source is sent to the different video output. This produces a larger video display area by combining multiple screen to be use.

Figure 13A:
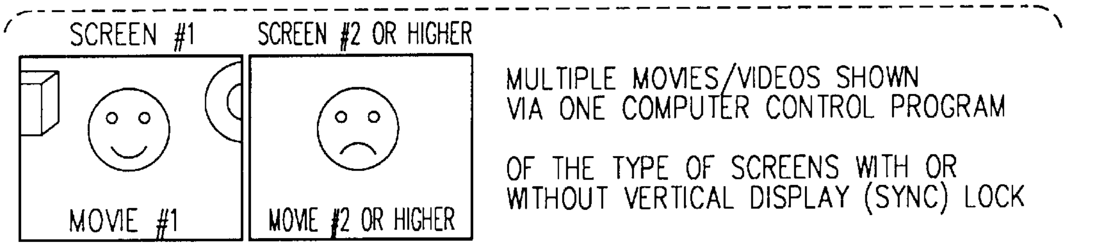
FIGS. 13A–E are examples of various displays that are possible using the circuitry described in the present application.

FIGS. 13A–E are examples of various displays that are possible using the circuitry described in the present application. The displays can be, for example, CRTs or LCDs. Based on these descriptions, those skilled in the relevant arts will be able to produce these displays. As shown in FIG. 13A, separate movies can be shown in separate displays, all under the control of a single computer control program. The images of the separate movies can be synchronized or not.

Figure 13B:
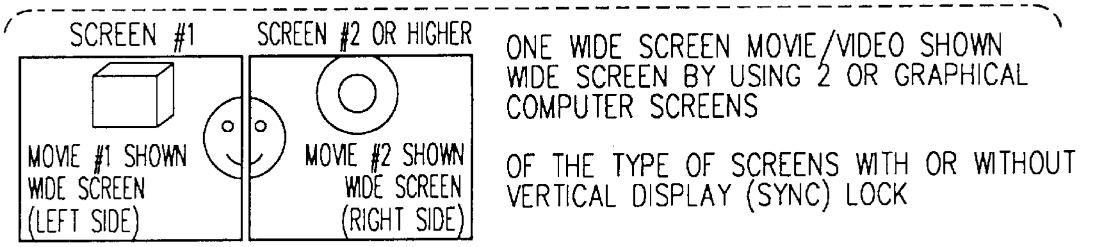
Figure 13C:
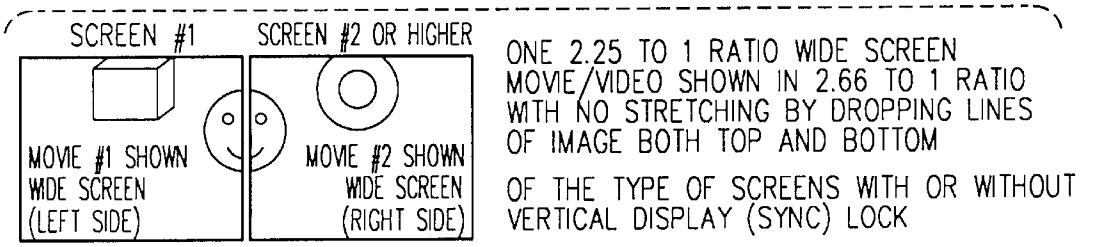

As shown in FIG. 13B, a single movie can be shown in the two displays configured as a wide screen. As shown in FIG. 13C, the aspect ratio of the single movie can be adjusted to produce an image without any stretching, by dropping lines of the image from both the top and bottom or the display screens. Again, the images of the separate movies can be synchronized or not.

Figure 13D:
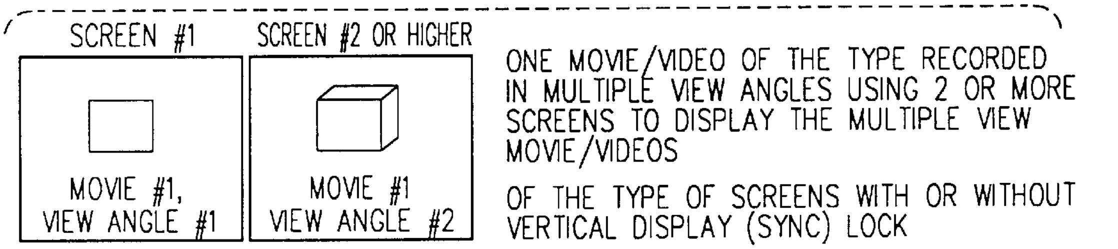

As shown in FIG. 13D, multiple view angles of the same scene can be shown in the display screens. Again, the images of the separate movies can be synchronized or not.

Figure 13E:
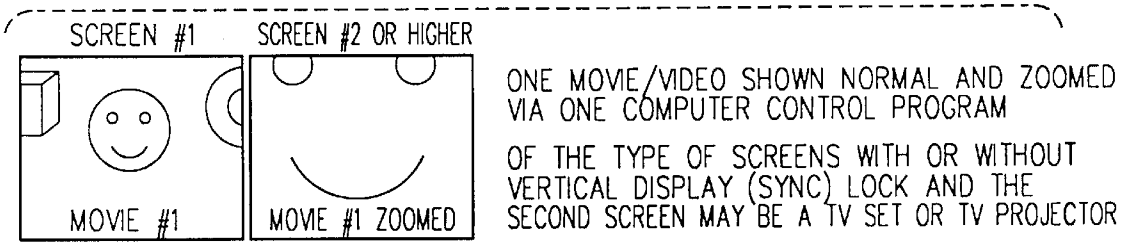
Figures 1, 14A:
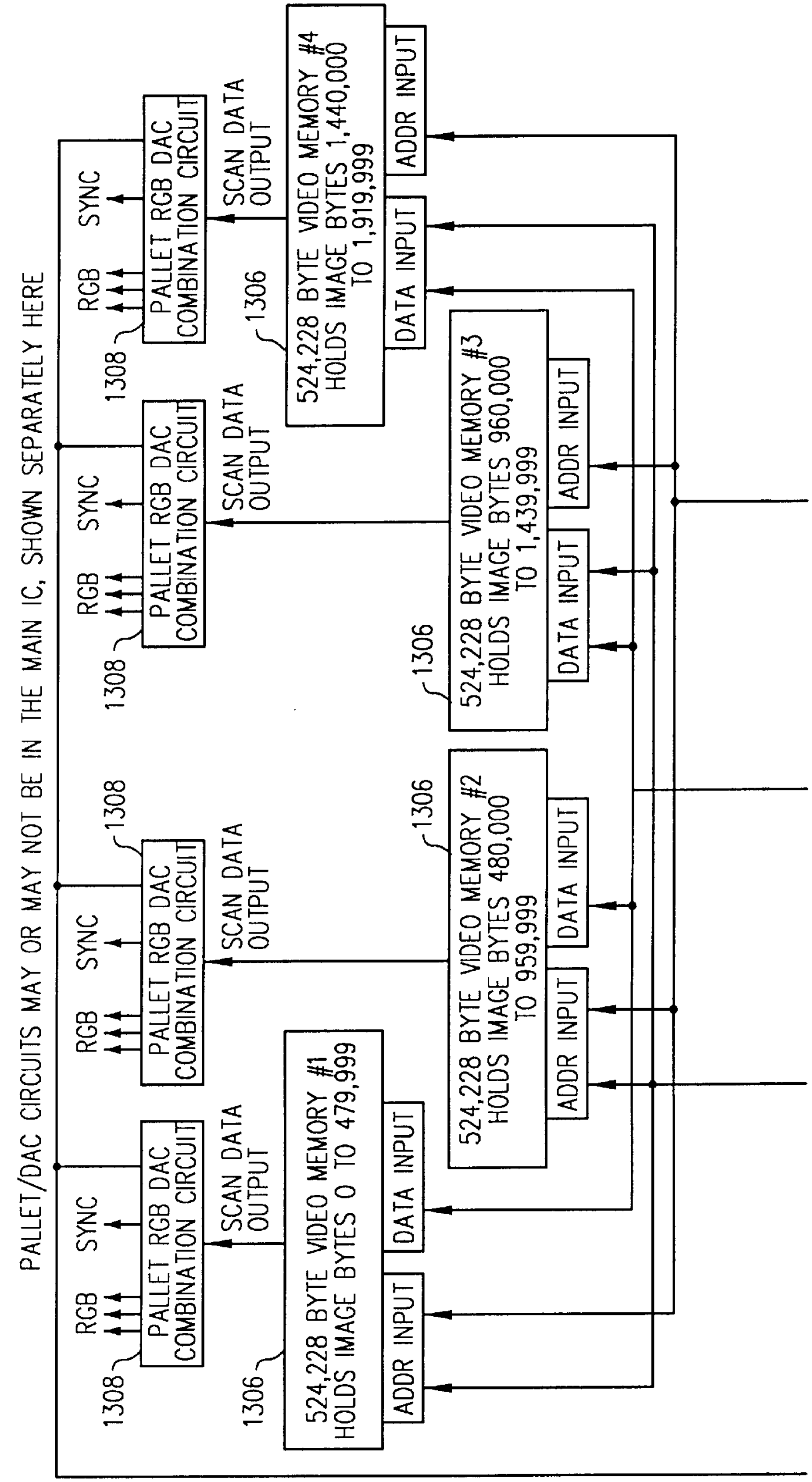
Figures 2, 14A:
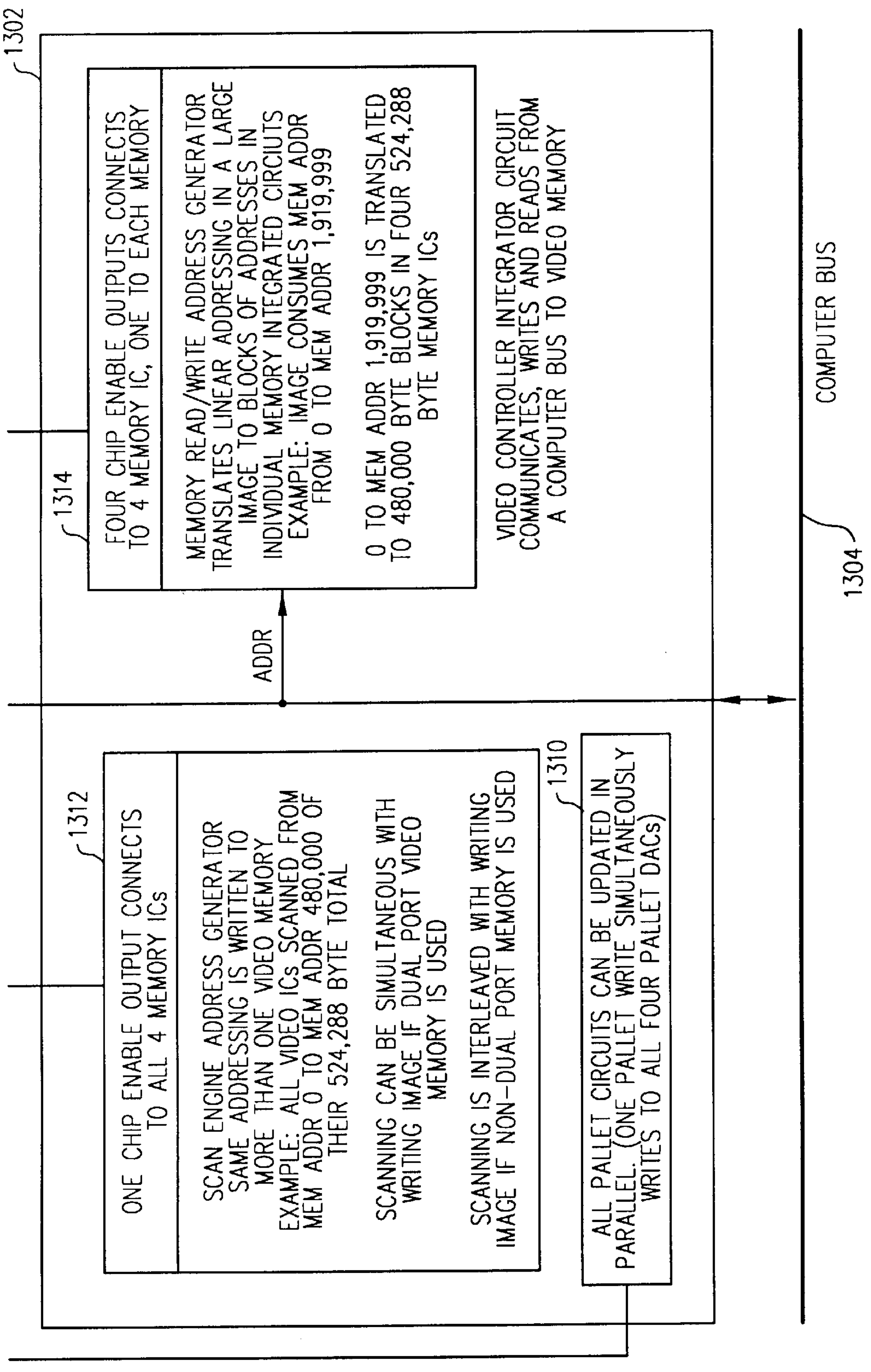

As shown in FIG. 13E, two distinct views of the same scene can be shown in the display screens. In this case, one of the views can be a normal view, with the other of the views can be a zoomed view. Again, the images of the separate movies can be synchronized or not. Also, the second screen may be a TV set or TV projector. Having a zoomed view available can be useful is a computer user wants an audience to see a small area of the user's screen, so that the audience watches a screen or TV image of this smaller area. The zoomed area is also especially useful as a TV output for users operating computers as video movie editing machines.

Figure 14B:
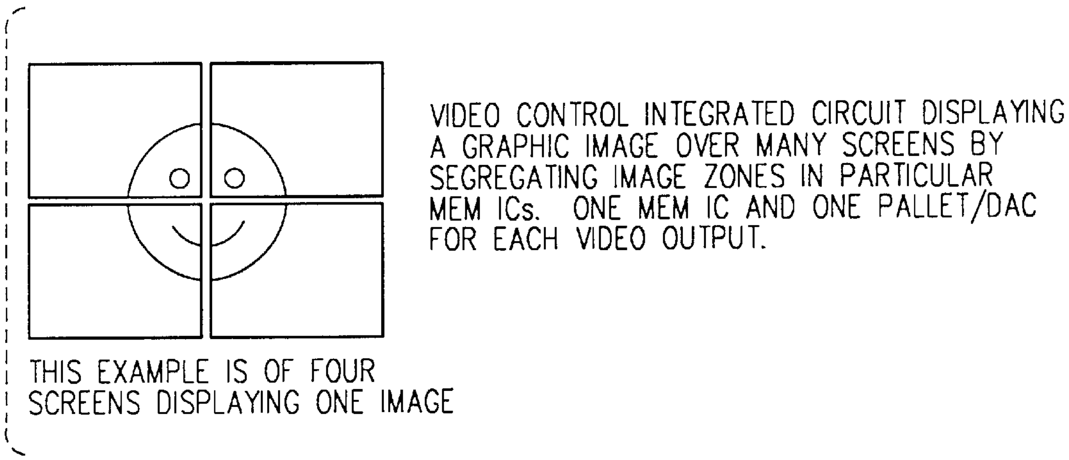

FIG. 14 is a schematic diagram of a circuit which can provide an exemplary display of a graphic images over several display devices, and FIG. 14B is the exemplary display. The circuit 1300 includes an integrated circuit 1302 connected to a bus 1304, a plurality of memories 1306, and a plurality of digital-to-analog circuits (DACs) 1308. The integrated circuit 1302 is a video controller integrator circuit and communicates, writes and reads from the computer bus 1304 to video memory. The integrated circuit 1302 includes circuitry 1310 that can simultaneously write to all four DACs 1308. It also includes a memory drive circuit 1312 that can enable any selected one of the memories 1306. The integrated circuit 1302 further includes circuitry 1314 that can be addressed to cause particular portions of the memories 1306 to receive data that is to be displayed by being passed on to the DACs 1308.

The present invention is user for reproducing movies and video having horitzonital and vertical resolutions that are ultiples of the original video material, thereby avoiding visual artifacts on multi-screen systems. For example, where a video movie is stored in 720×480 resolution, on a two screen system this is shown as 1440×480 resolution where two display horizontal pixels are used to reach original data pixel.

Video care software drivers have receive refresh frame rates and specific commands from movie play software to use those specific rates. For example, where the PAL TGV standard refresh rate is 50 Hz, and image will be shown in a progress scan computer graphic multiscreen system at 100 Hz, whereas the multiple screens are vertically phase-llockede.

The NTSC TV standard interlace 60 Hz refresh will be shown in the multimonitor systems in 60 Hz and 120 Hz progressive scan rate. Motion pictures recorded on film at 24 frames per second will be shown at 72 Hz progressive scan refresh rate. Multi-screen video driver commands will be available to video playing software such as: setting the resolution for 2 screens, to set the refute rate for 2 screws, and setting the vertical phase clock for two screens.

The software can also supply information about how the screens are being displayed. For example, the software can tell the user whether the screens are phase-locked, what is the current vertical refute time, what percentage of the screen is displayed since last vertical synchronization. The software can also set the vertical interrupt to occur under a graphical desktop multi-tasking multi-screen computer program. It can also set the vertical interrupt to occur at any desired percent of screen from the vertical synch. Finally, the software can be used to set the two vertical interrupts to "ON". One is at vertical synchronization time, and the other is at a prescribed percentage of the display shown from the vertical synchronize time.

The controller circuitry can also have multiple configurations stored internally to allow fast switching of refresh rates. Numerous registers in the video controllers must presently be programmed by a video driver or video BIOS code and data to correctly after refresh rate. This can be stored in shadow registers and switched in to selected use upon vertical synchronization. This will provide for rapid switching from frame rates being used with particular videos. As an example, a 72 Hz refresh rate can be used for 24 frame/sec movies, or 100 Hz can be used for 50 frame/sec PAL TV material. The viewer will see no glitch when the frame rate is changed.

While the foregoing is a detailed description of the preferred embodiment of the invention, there are many alternative embodiments of the invention that would occur to those skilled in the art and which are within the scope of the present invention. Accordingly, the present invention is to be determined by the following claims.

TD114020

Appendix I

```
====================================
;-------------------------------------------------------------------------
;   Copyright (c) 1995, Tridium Research Inc.  All rights reserved.
;   This header is to be attached to all usage of this code. Under no
;   circumstance should this code be used without this header...
;-------------------------------------------------------------------------

;
; ENABLE.ASM
;
;       - This file initializes board, loads stock
;         driver and acts as a driver entry point
;         arbitrator to draw screen output to dual monitors.
;
;

.386

include cmacros.inc

incDevice EQU 1
include gdidefs.inc
include windefs.inc

include tridium.inc                    ; Tridium include file

;
; Generic equates used by the driver
;
GMEM_MOVABLE            equ     0002h
GMEM_ZEROINIT           equ     0040h
RC_DI_BITMAP            equ     0080h   ; can do device independent bitmaps
RC_SAVE_BITMAP          equ     0040h


externFP        GetSelectorLimit
externFP        AllocSelector
externFP        FreeSelector
externFP        PrestoChangeoSelector
externFP        AllocCSToDSAlias
externFP        AllocDSToCSAlias
externFP        GetProcAddress
externFP        LoadLibrary
```

TD114020

```
externFP        FreeLibrary
externFP        FreeModule
externFP        GetModuleHandle
externFP        GetPrivateProfileString
externFP        GetPrivateProfileInt
externFP        WritePrivateProfileString

externFP        GlobalAlloc
externFP        GlobalRealloc
externFP        GlobalFree
externFP        GlobalLock
externFP        GlobalUnlock
externFP        GetVersion

externNP        hook_int_2Fh            ;Hook into multiplexed interrupt
externNP        restore_int_2Fh         ;Restore multiplexed interrupt

include tridata.asm

sBegin  Code

assumes cs,Code
assumes ds,Data
assumes es,nothing

DRV_ENTRY_SIZE          equ     NUM_OF_ENTRIES * 4

; Entry point that not in this module
public  OrigBitBlt,OrigStretchBlt,OrigFastBorder        ; bitblt.asm
public  OrigDibToDevice,OrigStretchDIBits               ; dib.asm
public  OrigOutput,OrigScanLR,OrigPixel                 ; output.asm
public  OrigExtTextOut,OrigStrblt                       ; text.asm
public  OrigSetCursor,OrigMoveCursor,OrigCheckCursor    ; cursor.asm
public  OrigSetPalette,OrigGetPalette
public  OrigSetPaletteTranslate,OrigGetPaletteTranslate
public  OrigUpdateColors,OrigColorInfo                  ; palette.asm
public  OrigDrvTable

OrigDrvTable            label   byte

OrigBitBlt              dd      0       ; ordinal 1
OrigColorInfo           dd      0
OrigControl             dd      0
OrigDisable             dd      0
OrigEnable              dd      0
OrigEnumDFonts          dd      0
OrigEnumObj             dd      0
OrigOutput              dd      0
```

TD114020

```
OrigPixel               dd      0
OrigRealizeObject       dd      0
OrigStrblt              dd      0
OrigScanLR              dd      0
OrigDeviceMode          dd      0

OrigExtTextOut          dd      0       ; ordinal 14
OrigGetCharWidth        dd      0
OrigDeviceBitmap        dd      0
OrigFastBorder          dd      0
OrigSetAttribute        dd      0

OrigDeviceBitmapBits    dd      0       ; ordinal 19
OrigCreateBitmap        dd      0
OrigDibToDevice         dd      0
OrigSetPalette          dd      0
OrigGetPalette          dd      0
OrigSetPaletteTranslate dd      0
OrigGetPaletteTranslate dd      0
OrigUpdateColors        dd      0
OrigStretchBlt          dd      0
OrigStretchDIBits       dd      0
OrigSelectBitmap        dd      0
OrigBitmapBits          dd      0

OrigSaveScreenBitmap    dd      0       ; oridnal 92
OrigInquire             dd      0
OrigSetCursor           dd      0
OrigMoveCursor          dd      0
OrigCheckCursor         dd      0
OrigGetDriverResourceID dd      0
OrigUserRepaintDisable  dd      0
OrigSetColorTranslate   dd      0


public  StartOfDriverEntrypoints
StartOfDriverEntrypoints        db      90


;--------------------------------------------------------------------
;
; Window 3.x entry point implementation
;
;--------------------------------------------------------------------


;--------------------------------------------------------------------
;
```

0965117.112830

TD114020

```
;       INITIALIZATION and HARDWARE DEPENDENT ROUTINES
;
;---------------------------------------------------------------------
cProc   GetDriverResourceID,<FAR,PUBLIC,WIN,PASCAL>
        parmW  iResID
        parmD  lpResType cBegin

        ; Check if stock driver loaded
        push    es
        pusha
        pushf
        cmp     DrvLoaded,0
        jne     @f                      ; yes
        call    LoadStockDrv

      @@:
        ;push   iResID
        ;les    di,lpResType
        ;push   es
        ;push   di
        ;call   cs:OrigGetDriverResourceID

        popf
        popa
        pop     es
        mov     ax,iResID               ;Get res id into ax.
        xor     dx,dx                   ;dx must be zero.
cEnd

cProc   Inquire,<PUBLIC,FAR,WIN,PASCAL> ;,<si,di,es,ds>
        parmD   lp_cursor_info          ;Where to put the data
cBegin

        ; Check if stock driver loaded
        cmp     DrvLoaded,0
        jne     @f                      ; yes
        call    LoadStockDrv

      @@:
        pop     ds
        pop     bp
        dec     bp
        jmp     cs:OrigInquire cEnd

assumes ds,Data
assumes es,nothing
cProc   Enable,<FAR,PUBLIC,WIN,PASCAL>
        parmD   lpDevInfo
```

TD114020

```
        parmW   wStyle
        parmD   lpDestDevType
        parmD   lpOutputFile
        parmD   lpData
        localW  hBitmap
        localW  saveAX cBegin

        ; Check if stock driver loaded
        cmp     DrvLoaded,0
        jne     @f                      ; yes
        call    LoadStockDrv

      @@:
        pusha
        CheckDualMonitor EnableRet_Default

        inc     EnableCount             ; increment counter
        cmp     EnableCount,2
        jbe     @f                      ; 1st or 2nd call
        jmp     EnablePassBack

      @@:
        ; do business
        push    es
        push    ds
        push    si
        push    di

        les     di,lpDevInfo
        mov     ax,es
        cmp     wStyle,0                ; 1st or 2nd call?
.386
        je      Enable_InitDev

        ; Here to retrieve GDIINFO structure
        ;
        mov     SelGDIInfo,ax
        mov     OffGDIInfo,di
        call    ChainEnable             ; go do it

        ; patch GDIINFO
        mov     ax,SelGDIInfo
        mov     es,ax
        mov     di,OffGDIInfo

        ; modify horizontal resolution
        mov     ax,es:[di+8]            ; horz resolution
        mov     BaseResX,ax             ; save in global
```

TD114020

```
        shl     ax,1                    ; double
        mov     es:[di+8],ax            ; done

        mov     DualResX,ax             ; save in global

        mov     es:[di+52],ax
        mov     es:[di+60],ax
        mov     es:[di+68],ax
        mov     es:[di+76],ax
        mov     es:[di+84],ax

        ;int 3
        mov     ax,es:[di+4]            ; horz size
        shl     ax,1                    ; double
        mov     es:[di+4],ax            ; done

        mov     ax,es:[di+10]           ; vert resolution
        mov     BaseResY,ax             ; save in global
        mov     DualResY,ax             ; save in global
        int 3
        and     word ptr es:[di+38], NOT RC_SAVE_BITMAP
        ;and    word ptr es:[di+38], NOT 0800h
        and     word ptr es:[di].dpCaps1, NOT 1

AllocLocalBmp:
        push    word ptr BaseResX
        push    word ptr BaseResY
        push    word ptr 1
        ;push   word ptr 16
        push    wColorDepth
        push    dword ptr 0
        call    GDICreateBitmap
        cmp     ax, 0
        jz      stpb_exit
        mov     hBitmap, ax
        push    word ptr 0103h
        push    word ptr 0
        push    word ptr 0
        push    word ptr 0
        call    GDIGdiSeeGdiDo
        mov     es, ax
        call    GetVersion
        mov     bx, 0ah
        xchg    ah, al
        cmp     ax, 0332h
        jle     @f
        add     bx, 4
@@:
```

TD114020

```
        mov     di, hBitmap
        mov     si, es:[di]
        mov     di, es:[si+bx]                  ;  Get pointer bitmap header
        mov     ax, es:[si+14h]                  ;  Get pointer bitmap bits
        mov     es, di
        cmp     ax, 0
        jnz     large_bitmap
        mov     word ptr es:[0].bmBits, 020h
        mov     word ptr es:[0].bmBits+2, di
        jmp     got_bmBits large_bitmap:
        mov     word ptr es:[0].bmBits, 0
        mov     word ptr es:[0].bmBits+2, ax
got_bmBits:
        mov     word ptr lpLocalBmpBuf+2, di
        mov     word ptr lpLocalBmpBuf, 0

stpb_exit:

        pop     di
        pop     si
        pop     ds
        pop     es
        popa
        mov     ax, 06eh
        jmp     EnableRet               ; return to GDI

    Enable_InitDev:
        ; Initialize physical device
        ;
        mov     SelGDIInfo,ax
        mov     OffGDIInfo,di

        Enable2HeadDisplay
        call    ChainEnable             ; go do it

        EnableHomeDisplay
        call    ChainEnable             ; go do it

        call    hook_int_2Fh            ;Hook into multiplexed interrupt

        call    SetEDCLKLow

        pop     di
        pop     si
        pop     ds
        pop     es
        popa
        jmp     EnableRet               ; return to GDI
```

TD114020

```
    EnablePassBack:
      popa
      pop     ds
      pop     bp
      dec     bp
      jmp     cs:OrigEnable

    EnableRet_Default:
      call    ChainEnable
      mov     saveAX,ax
      popa
      mov     ax,saveAX

    EnableRet:          cEnd

; This routine arrange Enable parameters and call back to
; stock driver
ChainEnable     proc    near

        les     di,lpDevInfo
        push    es
        push    di
        push    wStyle
        les     di,lpDestDevType
        push    es
        push    di
        les     di,lpOutputFile
        push    es
        push    di
        les     di,lpData
        push    es
        push    di
        call    cs:OrigEnable
        ret

ChainEnable     endp

LoadStockDrv    proc

.386
        mov     ax, ds
        push    ax
        push    OFFSET pSect
        push    ax
        push    OFFSET pBiosEntry
        push    0c000h
```

09152884.111598

TD114020

```
        push    ax
        push    OFFSET pSystemIni
        call    GetPrivateProfileInt
        mov     BiosAddress, ax

        mov     ax, ds
        push    ax
        push    OFFSET pSect
        push    ax
        push    OFFSET pColorDepthEntry
        push    word ptr 8
        push    ax
        push    OFFSET pSystemIni
        call    GetPrivateProfileInt
        mov     wColorDepth, ax

        mov     ax, ds
        push    ax
        push    OFFSET pSect
        push    ax
        push    OFFSET pDrvNameEntry
        push    ax
        push    OFFSET DrvName
        push    ax
        push    OFFSET DrvName
        push    word ptr DRVNAME_SIZE

        push    ax
        push    OFFSET pSystemIni
        call    GetPrivateProfileString

        call    HouseKeep
        mov     DrvLoaded,1             ; set flag
        Enable2HeadDisplay
        call    CheckMonitor
        cmp     bl,2
        jne     @f                      ; keep going
        mov     Connect2nd,0
@@:
        EnableHomeDisplay
        push    ds
        push    OFFSET GDIModuleName   ; name of GDI
        call    GetModuleHandle         ; handle to GDI
        test    ax, ax
        jz      load_drv_exit
        mov     hInstLib, ax

        push    hInstLib
```

TD114020

```
        push    ds
        push    OFFSET CreateBitmapName  ; GetProcAddress to CreateLibrary
        call    GetProcAddress

        test    dx, dx
        jz      load_drv_exit
        mov     word ptr GDICreateBitmap, ax
        mov     word ptr GDICreateBitmap+2, dx

        push    hInstLib
        push    ds
        push    OFFSET GdiSeeGdiDoName  ; GetProcAddress to GdiSeeGdiDo
        call    GetProcAddress

        test    dx, dx
        jz      load_drv_exit
        mov     word ptr GDIGdiSeeGdiDo, ax
        mov     word ptr GDIGdiSeeGdiDo+2, dx

        push    hInstLib
        push    ds
        push    OFFSET DeleteObjectName  ; GetProcAddress to DeleteObject
        call    GetProcAddress

        test    dx, dx
        jz      load_drv_exit
        mov     word ptr GDIDeleteObject, ax
        mov     word ptr GDIDeleteObject+2, dx
.286

;       call    HouseKeep
;       mov     DrvLoaded,1             ; set flag

        push    ds
        push    OFFSET DrvName
        call    LoadLibrary
        mov     hInstLib,ax             ; save handle

        xor     ax,ax
        push    ax
        cCall   AllocSelector           ; get a free selector
        mov     bx,_TEXT
        cCall   PrestoChangeoSelector,<bx,ax>

        mov     es,ax
        assumes es,Code

        mov     si, offset DrvEntryOrdinal
```

TD114020

```
        lea     bx, es:OrigDrvTable
        mov     cx, NUM_OF_ENTRIES

    GetEntryLoop:
        push    bx                      ; push parameters
        push    cx
        push    es

        push    hInstLib
        sub     ax,ax
        push    ax
        push    [si]                    ; ordinal
        call    GetProcAddress          ; get address of proc

        pop     es
        pop     cx
        pop     bx

        mov     word ptr es:[bx], ax
        mov     word ptr es:[bx+2], dx
        add     bx, 4
        add     si, 2
        dec     cx
        jnz     GetEntryLoop

        push    es
        cCall   FreeSelector

load_drv_exit:
        ret

LoadStockDrv    endp


;------------------------------------------------------------------------
;
; Tridium hardware routines
;
;------------------------------------------------------------------------
HouseKeep       proc

        call    FindIOAddr
        call    SetupDualDisplay
;;;;;;; call    SetEDCLKLow             ; DO NOT WORK HERE !!!!!!

        ret

HouseKeep       endp
```

TD114020

```
; Find IO address for graphics blaster
FindIOAddr      proc

;;      mov     GB_IOAddr,284h
        mov     dx,2b0h
        call    Find6805
        jc      @f

        mov     MasterPort,2b0h
        mov     GB_IOAddr,2b4h
        jmp     short FIO_Ret
@@:
        mov     dx,2a0h
        call    Find6805
        jc      @f

        mov     MasterPort,2a0h
        mov     GB_IOAddr,2a4h
        jmp     short FIO_Ret
@@:
        mov     dx,290h
        call    Find6805
        jc      @f

        mov     MasterPort,290h
        mov     GB_IOAddr,294h
        jmp     short FIO_Ret
@@:
        mov     dx,280h
        call    Find6805
        jc      @f

        mov     MasterPort,280h
        mov     GB_IOAddr,284h
        jmp     short FIO_Ret
@@:
        mov     dx,offset NotFoundErr
        mov     ah,9
        int     21h

FIO_Ret:
        ret

FindIOAddr      endp


; Establish dual display environment SetupDualDisplay proc
```

```
        mov     bx,1100h                ; open command
        call    Set6805
        mov     bx,1100h                ; open command
        call    Set6805

;;;;        mov     bx,041ch            ; turn on MASTER chip

;; Modified per Sergey's suggestion on 12/4/95
;;
;; - to fix TV daughter card bug

        mov     bx,049ch                ; turn on MASTER chip

        call    Set6805

        mov     bx,03feh                ; turn on MASTER chip
        call    Set6805

        Disable2Display
        Enable2HeadDisplay
        call    PostBIOS
        ret

SetupDualDisplay endp


SetEDCLKLow proc
        public  SetEDCLKLow

        push    ax
        push    bx
        push    cx
        push    dx

        Disable2Display

        EnableHomeDisplay
        call    WideVSync

        Enable2HeadDisplay
        ; set EDCLK low
        ;

        mov     bx,1602h        ; command and data
        call    Set6805

        ; Change MISC register to use external clock
```

TD114020

```
        ;
        mov     dx,3cch
        in      al,dx
        or      al,08h          ; turn on CLOCK SELECT [1]
        mov     dx,3c2h
        out     dx,al           ; done

        call    WideVSync

        Disable2Display
        EnableHomeDisplay
        pop     dx
        pop     cx
        pop     bx
        pop     ax

        ret

SetEDCLKLow endp

ResetEDCLK proc
        public  ResetEDCLK

        push    ax
        push    bx
        push    cx
        push    dx

        Disable2Display
        Enable2HeadDisplay
        ; reset EDCLK
        ;
        mov     bx,160ah        ; command and data
        call    Set6805

        ; Change MISC register to use external clock
        ;
        mov     dx,3cch
        in      al,dx
        and     al,not 08h      ; turn off CLOCK SELECT [1]
        mov     dx,3c2h
        out     dx,al           ; done


        Disable2Display
        EnableHomeDisplay
        pop     dx
        pop     cx
```

08931562.041599

TD114020

```
        pop     bx
        pop     ax

        ret

ResetEDCLK endp

WideVSync       proc

        ; Make vertical sync as wide as possible
        ;
        call    get_crtc_addr

        mov     al,10h          ; Vertical Sync Start register
        out     dx,al
        inc     dx
        in      al,dx
        dec     dx              ; back up

        add     al,0fh          ; max value
        and     al,0fh          ; filter into 4 LSB
        mov     ah,11h          ; Vertical Sync End register
        xchg    al,ah           ; swap index and data
        out     dx,ax
        ret

WideVSync       endp

; Routine to program 6805 chip
;
; BX = data
;
Set6805 proc

        ; read I/O addr twice
        mov     dx,MasterPort
        mov     cx,1000

S6805_Loop1:
        in      al,dx
        or      al,al
        jz      @f              ; done

        sub     ax,ax
        out     dx,ax
        loop    S6805_Loop1
@@:
```

TD114020

```
        ; Set 6805
        mov     ax,bx
        out     dx,ax

        ; read I/O twice again
        mov     cx,1000
S6805_Loop2:
        in      al,dx
        cmp     al,0ffh
        je      @f
        loop    S6805_Loop2
@@:
        ; Send ACK byte (00) to IO address
        sub     ax,ax
        out     dx,ax

        ; another shot
        mov     cx,1000
S6805_Loop3:
        in      al,dx
        or      al,al
        jz      @f
        loop    S6805_Loop3
@@:
        clc                     ; OK
        ret

Set6805 endp

; Re-post video BIOS
                public  PostBIOS
PostBIOS        proc

        mov     ax,0301h        ; call real mode routine
        mov     bh,0
        mov     cx,0
        push    DataBASE
        pop     es
        lea     di,EnvData
        int     31h
        ret

PostBIOS        endp

;
; This routine is used to determine whether analog monitor is connected
; to Tridium's dual head graphics board.
;
```

TD114020

```
; return
;       BL      0 = color
;               1 = gray monitor
;               2 = no monitor
;
CheckMonitor PROC        NEAR

        push    dx              ;Save EXTIDX
        call    get_crtc_addr   ;Get CRTC Stat to reset AR flip-flop
        add     dl,6
        in      al,dx

        mov     dl,Low(3C0h)    ;Read current AR11

        in      al,dx
        mov     bh,al

        mov     al,11h
        out     dx,al
        inc     dx
        in      al,dx

        mov     bl,al           ;BL = current AR11
        xor     al,al           ;Force screen blank w/color 0
        dec     dx              ;DX = 3C0
        out     dx,al
        pop     dx              ;DX = EXTIDX

        push    bx              ;Save current ARX state

        MOV     AH,014H                         ;Verify all three guns
        MOV     CX,01414H                       ;are responding
        CALL    Read_Monitor_Sense              ;Write DAC and read sense
        JE      Mono_Type                       ;Maybe it's a gray monitor

        xor     bl,bl                           ;return value for color
        jmp     short DAM_Exit

Mono_Type:
        MOV     AH,004H                         ;Test green gun against
        MOV     CX,01404H                       ;threshold, R, B below thres.
        CALL    Read_Monitor_Sense              ;Write DAC and read sense
        JE      Null_Monitor_Type               ;No monitor if no green

        mov     bl,01h                          ; return value for 8503
        jmp     short DAM_Exit

Null_Monitor_Type:
```

TD114020

```
        mov     bl,02h                          ; return value for no connect DAM_Exit:

        pop     cx              ;Previous ARX state

        call    get_crtc_addr   ;Get CRTC Stat to reset AR flip-flop
        add     dl,6
        in      al,dx

        mov     dl,Low(3C0h)    ;Read current AR11
        mov     al,11h
        out     dx,al
        mov     al,cl           ;AL = previous AR11
        out     dx,al
        mov     al,ch
        out     dx,al

        RET

CheckMonitor ENDP

get_crtc_addr   proc

        mov     dx,3d4h
        push    dx
        mov     dx,3cch
        in      al,dx
        test    al,01h
        pop     dx
        jnz     @f
        xor     dl,60h                  ; 3b4h
@@:
        ret

get_crtc_addr   endp

;
;   Write the specified values to the DAC controller and then
;   read the switch sense. Writing different values to the red,
;   green, and blue guns is used to do monitor sensing using
;   the voltage comparitors of the VGA system.
;
;   Entry: AH - Red DAC value
;          CH - Green DAC value
;          CL - Blue DAC value
;
```

TD114020

```
;   Exit:   Z - Switch sense is zero
;          NZ - Switch sense is a one
;

Read_Monitor_Sense      proc
        PUSH    AX
        PUSH    CX                              ;Save callers registers

        XOR     BX,BX                           ;Use DAC register 0

        pushf
        cli

        PUSH    AX
        PUSH    CX                              ;Save DAC values

        MOV     AH,08H                          ;Set in retrace timout
        call    get_crtc_addr
        ADD     DX,06H                          ;move to input status reg

Vert_Out:
        DEC     AH                              ;wait a long time
        Jz      Vert_In_Loop                    ;Skip if count exhausted

Vert_Out_Loop:
        IN      AL,DX                           ;Wait for retrace to complete
        TEST    AL,08                           ;and then catch it at the
        LOOPNE  Vert_Out_Loop                   ;start of the next retrace
        jne     Vert_Out

Vert_In_Loop:
        IN      AL,DX                           ;Get Vertical retrace
        TEST    AL,08                           ;Test for vertical retrace
        LOOPE   Vert_In_Loop                    ;No -Keep waiting for entry
        POP     CX                              ;Restore DAC values
        POP     AX

        call    out_DAC

        call    get_crtc_addr
        ADD     DX,06H                          ;status register 0
        XOR     CX,CX
        MOV     AH,4                            ;Set Timeout

        call    ChkRetrace

        popf                                    ;Restore interrupt enable status
```

TD114020

```
        TEST    AL,10H                          ;Test sense bit
        PUSHF                                   ;Save flag condition
        XOR     CX,CX
        XOR     AX,AX

        call    out_DAC                         ;(3/22/93) V1.20a4

        POPF                                    ;Restore flags

        POP     CX                              ;Restore registers
        POP     AX
        RET
Read_Monitor_Sense      endp

ChkRetrace      proc

        DEC     AH                              ;Down one
        JE      YYY                             ;Timed out

Horiz_In_Loop:
        IN      AL,DX                           ;Get Horizontal retrace
        TEST    AL,01                           ;Test for Horizontal retrace
        LOOPE   Horiz_In_Loop                   ;No -Keep waiting for entry
        JE      ChkRetrace YYY:
        mov     ah, 5                   ;put bigger value without setting cx=0 XXXX:
        dec     ah
        je      YYYY wait_for_on:
        IN      AL,DX                           ;Get Horizontal retrace
        TEST    AL,01                           ;Test for Horizontal retrace
        LOOPNE  wait_for_on                     ;No -Keep waiting for entry
        JNE     XXXX
YYYY:
        MOV     DX,3c2h
        IN      AL,DX                           ;from miscellaneous reg
        ret

ChkRetrace      endp


out_DAC proc

        MOV     DX,3c8h
        MOV     AL,BL                           ;Get index register
        OUT     DX,AL                           ;Select register to load
        in      al, 80h
        INC     DX                              ;Move to DAC write register
        MOV     AL,AH                           ;Get red DAC value
        OUT     DX,AL                           ;Write red DAC value
```

TD114020

```
        in      al, 80h
        MOV     AL,CH                           ;Get green value
        OUT     DX,AL                           ;Write green DAC value
        in      al, 80h
        MOV     AL,CL                           ;Get blue value
        OUT     DX,AL                           ;Write blue DAC value
        ret

out_DAC endp

;
; dx = port number
;
Find6805 proc

        ; read I/O addr twice
        mov     cx,1000

F6805_Loop1:
        in      al,dx
        mov     ah,al           ; save in ah
        in      al,dx
        or      al,ah
        jz      @f              ; done

        sub     ax,ax
        out     dx,ax
        loop    F6805_Loop1
        or      cx,cx
        jz      F6805_ErrorRet
@@:

        ; Set 6805
        mov     ax,1100h
        out     dx,ax

        ; read I/O twice again
        mov     cx,1000
F6805_Loop2:
        in      al,dx
        mov     ah,al
        in      al,dx

        or      al,ah
        jnz     @f

        loop    F6805_Loop2
        or      cx,cx
```

TD114020

```
        jz      F6805_ErrorRet
@@:
        ; Send ACK byte (00) to IO address
        sub     ax,ax
        out     dx,ax

        ; another shot
        mov     cx,1000
F6805_Loop3:
        in      al,dx
        mov     ah,al
        in      al,dx
        or      al,ah
        jz      @f
        loop    F6805_Loop3
        or      cx,cx
        jz      F6805_ErrorRet
@@:
        clc                     ; OK
        ret

F6805_ErrorRet:
        stc
        ret

Find6805 endp

;------------------------------Pseudo-Code------------------------------;
; INT Disable(lpPDevice)
; DEVICE lpPDevice;
; {
;   physical_disable(lpPDevice);         // Do all the work here
;   return(-1);                          // Show success
; }
;-----------------------------------------------------------------------;
cProc   Disable,<FAR,PUBLIC,WIN,PASCAL>,<si,di,es,ds>

        parmD   lp_device

cBegin
.386
        Enable2HeadDisplay
        push    lp_device
        call    cs:OrigDisable

        EnableHomeDisplay
        push    lp_device
        call    cs:OrigDisable
```

TD114020

```
        call    restore_int_2Fh
        mov     ax,-1                   ;Show success
cEnd

;-------------------------------------------------------------------
;
;       PASS-THROUGH ENTRY POINT
;
;-------------------------------------------------------------------

cProc   Control,<FAR,PUBLIC,WIN,PASCAL>,<si,di,es,ds>

        parmD   lp_device
        parmW   nFunction
        parmD   lpInData
        parmD   lpOutData cBegin
        push    lp_device
        push    nFunction
        push    lpInData
        push    lpOutData
        call    cs:OrigControl cEnd

if 0
public  Control
Control proc    far
        jmp     cs:OrigControl
Control endp
endif

public  EnumDFonts
EnumDFonts      proc    far
        jmp     cs:OrigEnumDFonts
EnumDFonts      endp

public  EnumObj
EnumObj proc    far
        jmp     cs:OrigEnumObj
EnumObj endp


public  RealizeObject
RealizeObject   proc    far
        jmp     cs:OrigRealizeObject
RealizeObject   endp


public  DeviceMode
```

TD114020

```
DeviceMode      proc    far
        jmp     cs:OrigDeviceMode
DeviceMode      endp

public  GetCharWidth
GetCharWidth    proc    far
        jmp     cs:OrigGetCharWidth
GetCharWidth    endp

public  DeviceBitmap
DeviceBitmap    proc    far
        jmp     cs:OrigDeviceBitmap
DeviceBitmap    endp

public  SetAttribute
SetAttribute    proc    far
        jmp     cs:OrigSetAttribute
SetAttribute    endp

public  DeviceBitmapBits
DeviceBitmapBits        proc    far
        jmp     cs:OrigDeviceBitmapBits
DeviceBitmapBits        endp

public  CreateBitmap
CreateBitmap    proc    far
        jmp     cs:OrigCreateBitmap
CreateBitmap    endp

public  SelectBitmap
SelectBitmap    proc    far
        jmp     cs:OrigSelectBitmap
SelectBitmap    endp

public  BitmapBits
BitmapBits      proc    far
        jmp     cs:OrigBitmapBits
BitmapBits      endp

public  SaveScreenBitmap
SaveScreenBitmap        proc    far
        jmp     cs:OrigSaveScreenBitmap
SaveScreenBitmap        endp

public  UserRepaintDisable
UserRepaintDisable      proc    far
        jmp     cs:OrigUserRepaintDisable
UserRepaintDisable      endp
```

08871584.021500

TD114020

```
public  SetColorTranslate
SetColorTranslate       proc    far
        jmp     cs:OrigSetColorTranslate
SetColorTranslate       endp

public  EndOfDriverEntrypoints
EndOfDriverEntrypoints  db      90


sEnd    Code

end
```

TD114020

Appendix II

```
//      Tridium Screen Synchronization Example
//
//      This code assumes availability of the following subroutines (not shown)
//      each of which should normally correspond to a simple video hardware instruction
//      or other easily implemented routine:

//      void enableScreen( int screen )  determines whether following calls will
//                                       be made to the controller for the left or
//                                       right (or other) screen

//      BOOL recentVBI()                 returns TRUE if and only if there has been
//                                       a recent vertical blank interrupt, e.g.  in
//                                       last 2 milliseconds

//      int GetCountCompare()            retrieves the value of the vertical (or  horizontal)
//                                       count compare register

//      SetCountCompare( int i)          resets the value of the vertical (or  horizontal)
//                                       count compare register

//      Wait( int delay )                pauses for a specified time period
//

void synchronizeScreens()
{
//      before calling this routine, put all screens in the same video mode!

        BOOL result;

//      Declare one of the screens (video controllers) to be the master sync source
//      Here we will just let it be the leftmost screen
        syncMaster = LEFT_SCREEN;

        enableScreen( syncMaster );

//      Set up a vetical blank polling or vertical blank interrupt to execute
//      a subroutine, or separate program, when the the vertical blank occurs.
//      In this example, we use polling to call a subroutine when the blank occurs:

        for(;;)         // continue forever (until result==TRUE)
        {
                while( recentVBI() == FALSE )
                        ;       // wait
```

TD114020

```
                // we will get to this point only when recentVBI() returns TRUE
                // i.e. soon after a vertical blank interrupt

                // call the subroutine
                result = adjustSyncSlaves();

                // if the subroutine returns TRUE all slaves are in sync and we can
                // quit (exit the program or return to calling routine).
                // Otherwise, continue looping and wait for next VBI.
                if( result == TRUE ) return;
        }
}

// the subroutine: BOOL adjustSyncSlaves()
{
        BOOL result = TRUE;
        int originalCompare;

        for( screen=0; screen< slaveScreenCount; screen++)
        {
                enableScreen( controller[screen] );
                if( recentVBI() == FALSE )
                {
                        // this screen is not yet in sync
                        result = FALSE;

                        // change the sync on this screen by temporarily
                        // setting the vertical and or horizontal compare
                        // counter to a low value, and thereby cause the
                        // corresponding counter to get reset quickly.
                        // Repeatedly calling this routine will
                        // eventually bring the slave screen to within a
                        // few horizontal lines of vertical phase lock with
                        // the master.
                        originalCompare = GetCountCompare();
                        SetCountCompare(1);
                        Wait( ONE_LINE_DELAY_TIME );
                        SetCountCompare(originalCount);
                }
        }
        return result;
}
```

What is claimed is:

1. An apparatus for phase-locking a plurality of display devices, each of the display devices displaying an image under the control of a distinct clock having a distinct clock rate, each of the images containing a predetermined periodic indexing event, the apparatus comprising:

a designation circuit to receive each of the distinct clocks and to designate one of the distinct clocks to be a master clock and the remaining clocks to be slave clocks;

a synchronization circuit to synchronize the distinct clocks, the synchronization circuit including:

a clock rate comparison circuit to compare the clock rates of all of the distinct clocks and to determine the greatest difference between the rates of all of the distinct clocks, a control circuit to receive said greatest difference and to cause said greatest difference to be within a predetermined difference rate of one another, and a rate difference circuit to cause said predetermined difference rate to be reduced to zero;

a times-of-occurrence comparison circuit to receive the times of occurrence of the indexing events for the images displayed under the control of the master clock and the slave clocks, to compare the times of occurrence of the indexing event for the image displayed under the control of the master clock to the times of occurrence of the indexing events for the images displayed under the control of the slave clocks, and to produce signals indicative of the differences between the time of occurrence of the indexing event for the image displayed under the control of the master clock and the times of occurrence of the indexing events for the images displayed under the control of the slave clocks;

a reset circuit to receive the signals indicative of said differences, to compare the signals indicative of said differences, and, if any one of said differences exceeds a predetermined amount of time, to cause said corresponding time of occurrence of said slave clock to occur within the predetermined amount of time of the time of occurrence of the master clock; and a repetition circuit to iteratively cause the times-of-occurrence comparison circuit and the reset circuit to operate until the slave clocks are phase-locked.

2. An apparatus for phase-locking a plurality of display devices, each of the display devices displaying an image under the control of a distinct clock having a distinct clock rate, each of the images containing a predetermined periodic indexing event, the apparatus comprising:

a designation circuit to receive each of the distinct clocks and to designate one of the distinct clocks to be a master clock and the remaining clocks to be slave clocks;

a times-of-occurrence comparison circuit to receive the times of occurrence of the indexing events for the images displayed under the control of the master clock and the slave clocks, to compare the times of occurrence of the indexing event for the image displayed under the control of the master clock to the times of occurrence of the indexing events for the images displayed under the control of the slave clocks, and to produce signals indicative of the differences between the time of occurrence of the indexing event for the image displayed under the control of the master clock and the times of occurrence of the indexing events for the images displayed under the control of the slave clocks;

a reset circuit to receive the signals indicative of said differences, to compare the signals indicative of said differences, and, if any one of said differences exceeds a predetermined amount of time, to cause said corresponding time of occurrence of said slave clock to occur within the predetermined amount of time of the time of occurrence of the master clock; and a repetition circuit to iteratively cause the times-of-occurrence comparison circuit and the reset circuit to operate until the slave clocks are phase-locked.

* * * * *